(12) United States Patent
Asai et al.

(10) Patent No.: US 10,729,040 B2
(45) Date of Patent: Jul. 28, 2020

(54) COOLER, POWER CONVERSION APPARATUS, AND COOLING SYSTEM

(71) Applicant: MITSUBISHI ELECTRIC CORPORATION, Chiyoda-ku (JP)

(72) Inventors: Yugo Asai, Chiyoda-ku (JP); Shigetoshi Ipposhi, Chiyoda-ku (JP); Masaru Shinozaki, Chiyoda-ku (JP); Hiroyuki Higashino, Chiyoda-ku (JP); Kazuki Sakata, Chiyoda-ku (JP); Masakazu Tani, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/753,228

(22) PCT Filed: Apr. 22, 2016

(86) PCT No.: PCT/JP2016/062789
§ 371 (c)(1),
(2) Date: Feb. 16, 2018

(87) PCT Pub. No.: WO2017/047151
PCT Pub. Date: Mar. 23, 2017

(65) Prior Publication Data
US 2018/0249596 A1    Aug. 30, 2018

(30) Foreign Application Priority Data
Sep. 14, 2015    (JP) ................. 2015-180659

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01); *H05K 7/20272* (2013.01)

(58) Field of Classification Search
CPC ............ H05K 7/20927; H05K 7/20272; H01L 23/473
See application file for complete search history.

(56) References Cited

U.S. PATENT DOCUMENTS 3,512,582 A * 5/1970 Chu ...................... H01L 23/427
165/104.27
4,138,692 A * 2/1979 Meeker ............... H01L 23/4332
165/80.4

(Continued)

FOREIGN PATENT DOCUMENTS

| JP | 2005-79337 A | 3/2005 |
|----|--------------|--------|
| JP | 2013-16590 A | 1/2013 |
| JP | 2013-44496 A | 3/2013 |

OTHER PUBLICATIONS

Chinese Office Action dated Apr. 9, 2019, in Patent Application No. 201680052991.5, 15 pages (with unedited computer generated English translation).

*Primary Examiner* — Ljiljana V. Ciric
(74) *Attorney, Agent, or Firm* — Xsensus LLP

(57) ABSTRACT

A cooler configured to cool an electronic device includes: a refrigerant inlet portion configured to guide refrigerant from an outside of a casing to an inside of the casing; a refrigerant outlet portion configured to guide the refrigerant from the inside of the casing to the outside of the casing; and a metal member located inside the casing and configured to define a flow path region in which the refrigerant is caused to flow from the refrigerant inlet portion to the refrigerant outlet portion. The metal member includes: a plurality of opening portions configured to cause the refrigerant to pass therethrough; and a capture and reduction portion having such a shape as to capture air bubbles, which are generated through a connection surface between the casing and the electronic (Continued)

device. The air bubbles are reduced through cooling by the refrigerant when the electronic device is cooled.

26 Claims, 14 Drawing Sheets

(56) References Cited

U.S. PATENT DOCUMENTS

| | | | | |
|---|---|---|---|---|
| 4,223,723 | A * | 9/1980 | Hilal | F17C 9/02 165/133 |
| 4,531,146 | A * | 7/1985 | Cutchaw | H01L 23/433 257/697 |
| 4,572,286 | A * | 2/1986 | Fujii | F25B 23/006 165/104.19 |
| 4,653,579 | A * | 3/1987 | Fujii | F25B 23/006 165/104.21 |
| 4,704,658 | A * | 11/1987 | Yokouchi | H05K 7/203 165/104.33 |
| 4,712,609 | A * | 12/1987 | Iversen | H01L 23/473 165/133 |
| 4,823,712 | A * | 4/1989 | Wormer | C10J 3/54 110/245 |
| 4,949,164 | A * | 8/1990 | Ohashi | H01L 23/427 165/104.33 |
| 4,989,070 | A * | 1/1991 | Iversen | H01L 23/427 165/135 |
| 5,048,598 | A * | 9/1991 | Takemae | H05K 7/20272 137/597 |
| 5,048,599 | A * | 9/1991 | Tustaniwskyj | F24D 19/083 165/104.32 |
| 5,111,280 | A * | 5/1992 | Iversen | H01L 23/427 165/80.4 |
| 5,411,077 | A * | 5/1995 | Tousignant | F28D 15/02 165/104.33 |
| 5,427,174 | A * | 6/1995 | Lomolino, Sr. | F28D 15/0233 165/104.13 |
| 5,529,115 | A * | 6/1996 | Paterson | F28D 15/02 165/104.21 |
| 5,761,037 | A * | 6/1998 | Anderson | F28D 15/0266 165/104.26 |
| 5,796,798 | A * | 8/1998 | Aujollet | G21C 9/004 376/283 |
| 6,005,772 | A * | 12/1999 | Terao | F28D 15/0233 165/104.21 |
| 6,119,767 | A * | 9/2000 | Kadota | F28D 15/0233 165/104.33 |
| 6,397,936 | B1 * | 6/2002 | Crowley | F28D 15/043 122/366 |
| 6,527,045 | B1 * | 3/2003 | Osakabe | F28D 1/0333 165/104.33 |
| 7,013,956 | B2 * | 3/2006 | Thayer | F25B 23/006 165/104.25 |
| 7,035,104 | B2 * | 4/2006 | Meyer | F28F 3/12 165/104.33 |
| 7,556,086 | B2 * | 7/2009 | Joshi | F28D 15/0233 165/104.17 |
| 7,561,425 | B2 * | 7/2009 | Mindock | H01L 23/427 165/80.4 |
| 8,061,412 | B2 * | 11/2011 | Ippoushi | H01L 23/473 165/185 |
| 8,274,792 | B2 * | 9/2012 | Soffer | G06F 1/18 361/700 |
| 8,345,425 | B2 * | 1/2013 | Toyoda | F28D 1/05366 165/104.26 |
| 8,360,138 | B2 * | 1/2013 | Zhang | F28D 15/02 165/104.21 |
| 8,619,425 | B2 * | 12/2013 | Campbell | H05K 7/20809 165/80.4 |
| 8,636,052 | B2 * | 1/2014 | Kline | F28D 15/00 165/104.29 |
| 8,739,406 | B2 * | 6/2014 | Campbell | B23P 15/26 29/890.07 |
| 9,195,282 | B2 * | 11/2015 | Shelnutt | G06F 1/20 |
| 9,605,907 | B2 * | 3/2017 | Sakamoto | F28D 15/0266 |
| 9,646,916 | B1 * | 5/2017 | Emma | H04B 10/2503 |
| 9,852,963 | B2 * | 12/2017 | Shedd | F25B 23/006 |
| 10,018,428 | B2 * | 7/2018 | Altman | F28F 21/08 |
| 10,070,558 | B2 * | 9/2018 | Campbell | H05K 5/06 |
| 10,264,706 | B2 * | 4/2019 | Wan | F25B 23/006 |
| 2003/0085024 | A1 * | 5/2003 | Santiago | B01D 19/0031 165/104.11 |
| 2003/0205363 | A1 * | 11/2003 | Chu | F28D 15/0266 165/80.3 |
| 2005/0063158 | A1 * | 3/2005 | Thiele | F28D 15/0266 361/700 |
| 2005/0178529 | A1 * | 8/2005 | Suzuki | F28D 15/0233 165/80.4 |
| 2005/0286227 | A1 * | 12/2005 | Erturk | H01L 23/427 361/702 |
| 2006/0060331 | A1 * | 3/2006 | Glezer | F28D 15/0266 165/104.29 |
| 2007/0084588 | A1 * | 4/2007 | Eckberg | H05K 7/20272 165/104.32 |
| 2007/0273024 | A1 * | 11/2007 | Madsen | F28D 15/0266 257/715 |
| 2007/0284088 | A1 * | 12/2007 | Chun | F28D 15/046 165/104.21 |
| 2008/0013278 | A1 * | 1/2008 | Landry | G06F 1/20 361/699 |
| 2008/0283221 | A1 * | 11/2008 | Terp | F28C 3/06 165/104.22 |
| 2009/0084525 | A1 * | 4/2009 | Satou | F28D 15/0266 165/104.21 |
| 2010/0071880 | A1 * | 3/2010 | Kim | F28D 15/0266 165/104.26 |
| 2011/0017431 | A1 * | 1/2011 | Yang | F28D 15/046 165/104.26 |
| 2011/0138838 | A1 * | 6/2011 | Despesse | F04B 17/00 62/324.1 |
| 2011/0146962 | A1 * | 6/2011 | Kamula | H05K 7/20927 165/175 |
| 2011/0192574 | A1 * | 8/2011 | Yoshikawa | F28D 15/0266 165/104.21 |
| 2011/0203772 | A1 * | 8/2011 | Hendricks | F28F 13/185 165/104.19 |
| 2012/0168131 | A1 * | 7/2012 | Gavillet | F28F 13/16 165/104.23 |
| 2013/0027878 | A1 * | 1/2013 | Campbell | H05K 7/2029 361/694 |
| 2014/0092551 | A1 * | 4/2014 | Pearson | H05K 7/20327 361/679.53 |
| 2014/0092558 | A1 * | 4/2014 | Pearson | H01L 23/473 361/699 |
| 2014/0196498 | A1 * | 7/2014 | Xiao | H01L 23/427 62/524 |
| 2014/0321053 | A1 * | 10/2014 | Donnelly | H05K 7/20236 361/691 |
| 2015/0068707 | A1 * | 3/2015 | Hamaguchi | H01L 23/473 165/96 |
| 2015/0359133 | A1 * | 12/2015 | Joshi | H05K 7/2029 361/700 |
| 2016/0356559 | A1 * | 12/2016 | Krug, Jr. | H05K 7/20272 |
| 2016/0379852 | A1 * | 12/2016 | Tustaniwskyj | H01L 21/67109 165/296 |
| 2017/0084514 | A1 * | 3/2017 | Kumari | H01L 23/427 |
| 2017/0105313 | A1 * | 4/2017 | Shedd | H05K 7/20272 |
| 2017/0179002 | A1 * | 6/2017 | Chainer | H01L 23/473 |
| 2017/0293329 | A1 * | 10/2017 | Chiriac | G06F 1/206 |
| 2017/0326489 | A1 * | 11/2017 | Lau | B01D 46/0005 |
| 2018/0098459 | A1 * | 4/2018 | Chainer | H05K 7/20254 |
| 2018/0368281 | A1 * | 12/2018 | Wang | H05K 7/20345 |
| 2020/0096849 | A1 * | 3/2020 | Iyoda | G03B 21/16 |

* cited by examiner

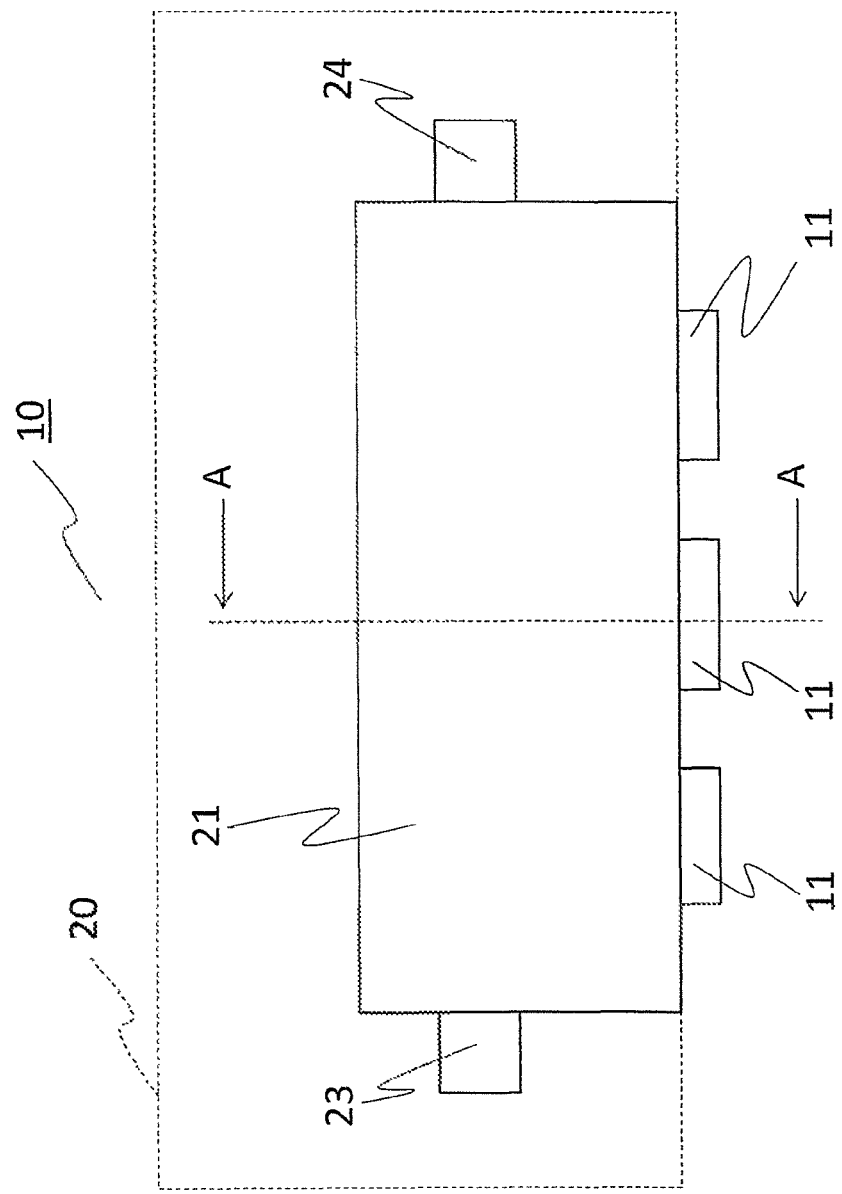

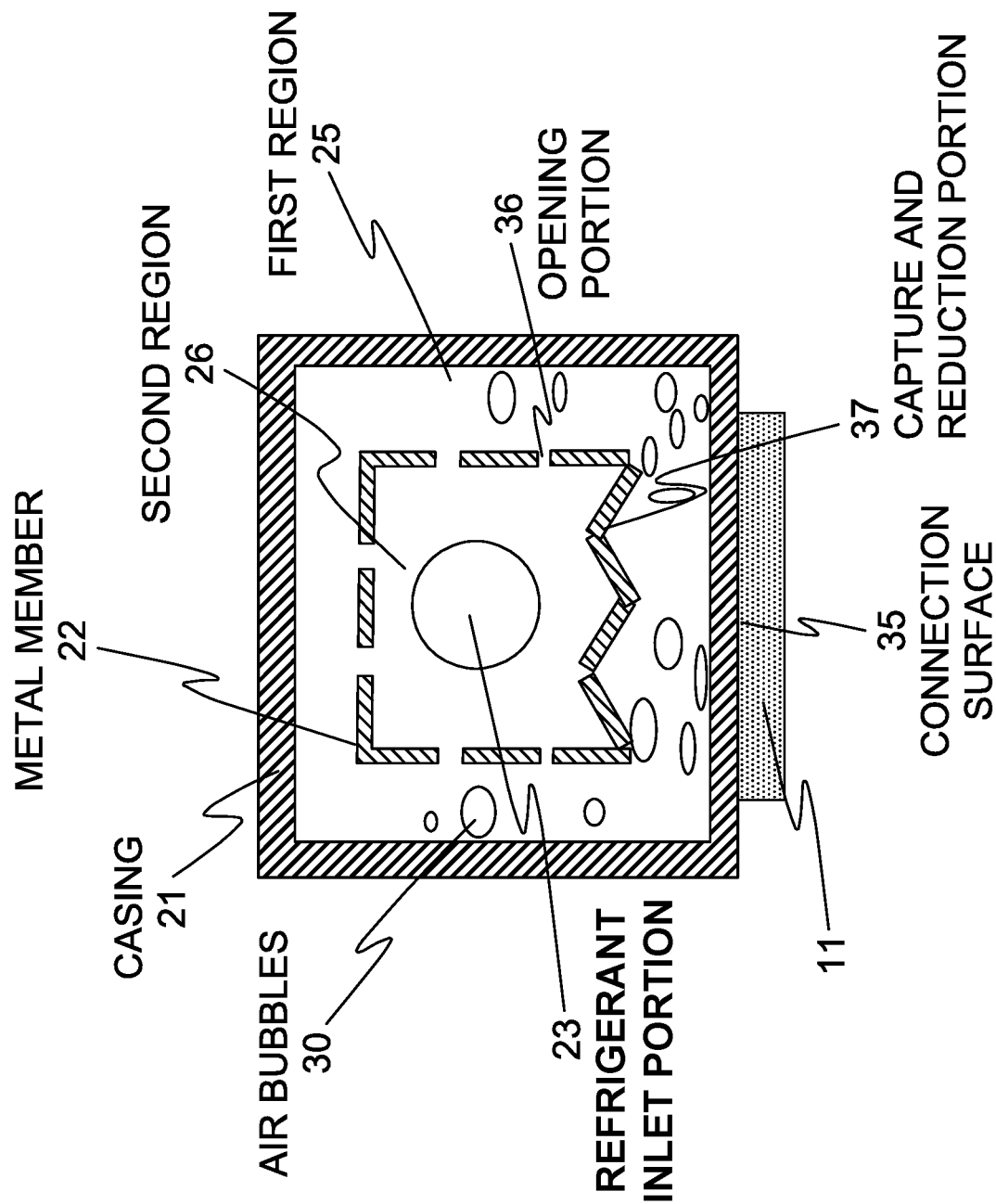

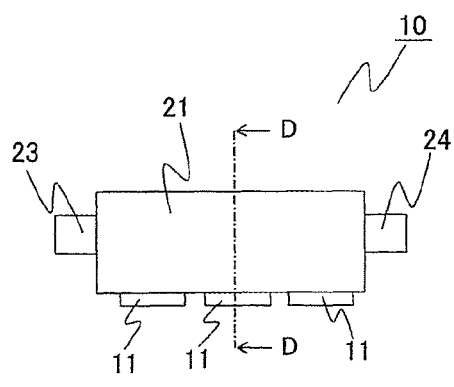
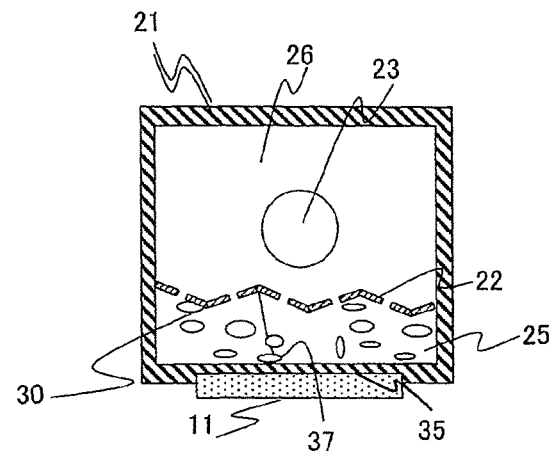
FIG. 8A    FIG. 8B
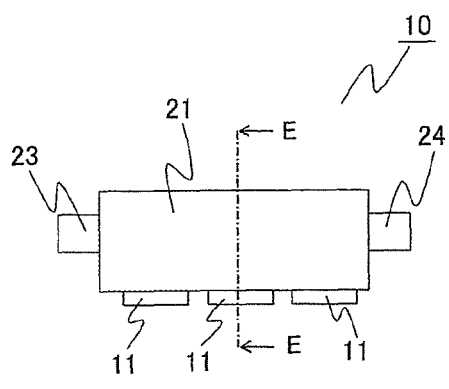
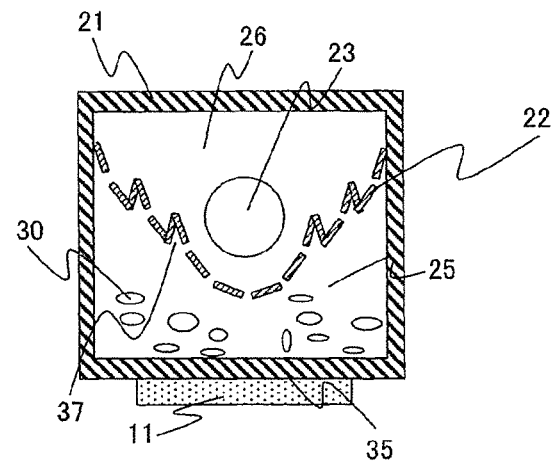
FIG. 9A    FIG. 9B

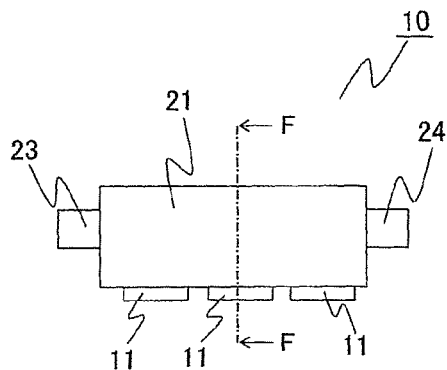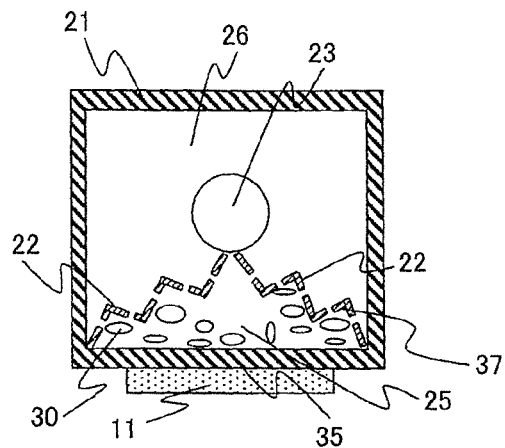
FIG. 10A  FIG. 10B
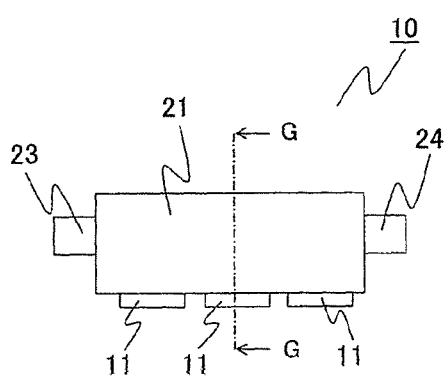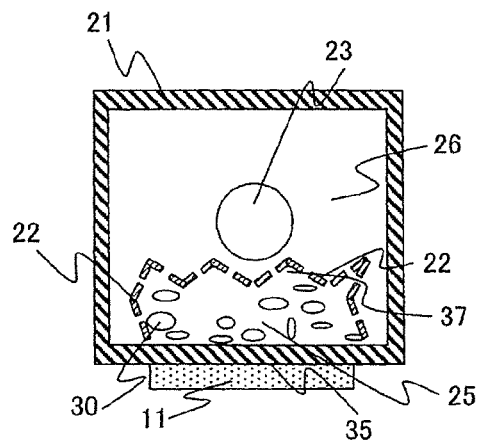
FIG. 11A  FIG. 11B

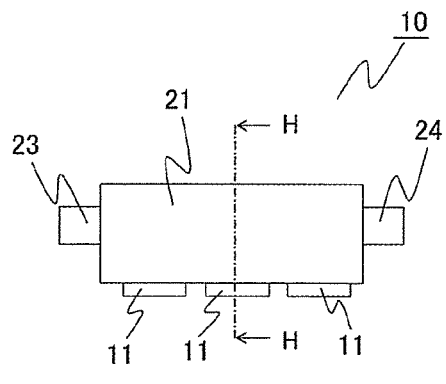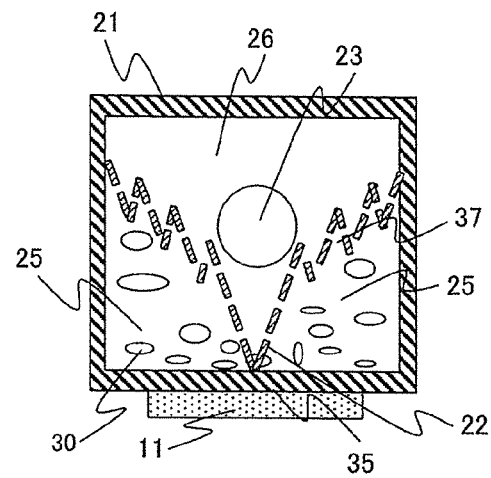
FIG. 12A  FIG. 12B
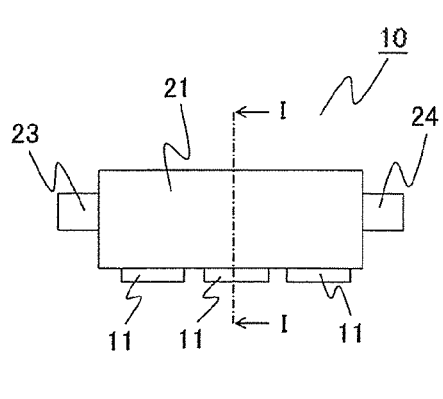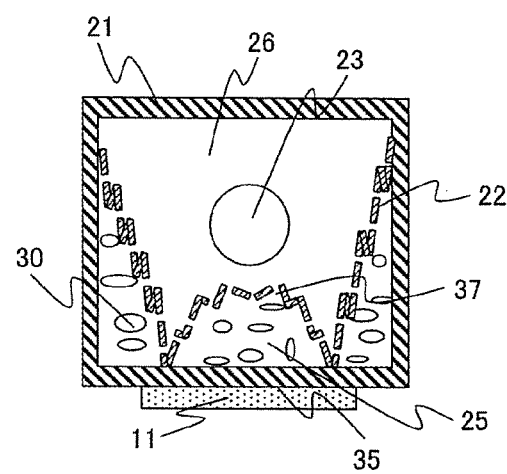
FIG. 13A  FIG. 13B

COOLER, POWER CONVERSION APPARATUS, AND COOLING SYSTEM

TECHNICAL FIELD

The present invention relates to a cooler which is configured to cool a heat-generating element such as an electronic device involving power conversion, a power conversion apparatus including the cooler, and a cooling system using the power conversion apparatus.

BACKGROUND ART

There has been generally known a cooling system configured to circulate air or liquid refrigerant. For example, the cooling system using the liquid refrigerant is configured to circulate the liquid refrigerant by a pump, cool a heat-generating element by a cooler, and release heat by a radiator. Further, there is disclosed a cooling system in which the liquid refrigerant is boiled by the cooler to enhance cooling performance (see, for example, Patent Literature 1).

CITATION LIST

Patent Literature

[PTL 1] JP 201344496 (paragraph 0026, FIG. 1)

SUMMARY OF INVENTION

Technical Problem

In such cooling system, there is a risk in that air bubbles generated in the cooler through boiling may flow into the pump. When the air bubbles are condensed in the pump, cavitation occurs, and hence there is a problem in that vibration, noise, and breakage of pipes may be caused.

The present invention has been made to solve the above-mentioned problem, and has an object to provide a cooler, a power conversion apparatus, and a cooling system which can prevent air bubbles generated in the cooler through the boiling from flowing out of the cooler, thereby being capable of enhancing an effect of preventing vibration, noise, and breakage of pipes.

Solution to Problem

In order to attain the above-mentioned object, according to one embodiment of the present invention, there is provided a cooler, which is configured to cool an electronic device by causing refrigerant to flow through an inside of a casing, the cooler including: a refrigerant inlet portion configured to guide the refrigerant from an outside of the casing to the inside of the casing; a refrigerant outlet portion configured to guide the refrigerant from the inside of the casing to the outside of the casing; and a metal member configured to define a flow path region in which the refrigerant is caused to flow from the refrigerant inlet portion to the refrigerant outlet portion in the inside of the casing, in which the metal member includes: a plurality of opening portions configured to cause the refrigerant to pass therethrough; and a capture and reduction portion having such a shape as to capture air bubbles, which are generated through a connection surface between the casing and the electronic device, so as to reduce the air bubbles through cooling by the refrigerant when the electronic device is cooled.

Further, according to one embodiment of the present invention, there is provided a power conversion apparatus, including: the above-mentioned cooler; and an electronic device, which is provided on at least one of an outer bottom surface or an outer side surface of the casing of the cooler, and heats the refrigerant in the casing.

Further, according to one embodiment of the present invention, there is provided a cooling system, which is configured to perform cooling by circulating refrigerant, including: a refrigerant pipe, through which the refrigerant flows; a pump, which is configured to circulate the refrigerant in the refrigerant pipe, and is connected to the refrigerant pipe; a radiator, which is connected to the refrigerant pipe, and is configured to release heat of the refrigerant which is circulated by the pump to an outside; and the above-mentioned power conversion apparatus, which is connected to the refrigerant pipe, and is cooled by the refrigerant which is circulated by the pump.

Advantageous Effects of Invention

According to the cooler, the power conversion apparatus, and the cooling system of the present invention, the metal member, which defines the flow path region in which the refrigerant is caused to flow from the refrigerant inlet portion to the refrigerant outlet portion in the inside of the casing, is provided in the cooler. The metal member includes the plurality of opening portions configured to cause the refrigerant to pass therethrough, and the capture and reduction portion having such a shape as to capture the air bubbles, which are generated through the connection surface between the casing and the electronic device, so as to reduce the air bubbles through the cooling by the refrigerant when the electronic device is cooled. With this configuration, it is possible to enhance the effect of preventing the air bubbles generated in the cooler through the boiling from flowing out of the cooler, thereby being capable of enhancing the effect of preventing the vibration, the noise, the breakage of the pipes.

BRIEF DESCRIPTION OF DRAWINGS

FIG. 3A is a side view of the power conversion apparatus according to the first embodiment of the present invention.

FIG. 3C is a schematic sectional view of another example of the power conversion apparatus according to the first embodiment of the present invention taken along the cutting position A-A of FIG. 3A.

FIGS. 8A and 8B are a side view of a power conversion apparatus according to a third embodiment of the present invention, and a schematic sectional view of the power conversion apparatus according to the third embodiment of the present invention taken along the cutting position D-D.

FIGS. 9A and 9B are a side view of a power conversion apparatus according to a fourth embodiment of the present invention, and a schematic sectional view of the power conversion apparatus according to the fourth embodiment of the present invention taken along the cutting position E-E.

FIGS. 10A and 10B are a side view of a power conversion apparatus according to a fifth embodiment of the present invention, and a schematic sectional view of the power conversion apparatus according to the fifth embodiment of the present invention taken along the cutting position F-F.

FIGS. 11A and 11B are a side view of a power conversion apparatus according to a sixth embodiment of the present invention, and a schematic sectional view of the power conversion apparatus according to the sixth embodiment of the present invention taken along the cutting position G-G.

FIGS. 12A and 12B are a side view of a power conversion apparatus according to a seventh embodiment of the present invention, and a schematic sectional view of the power conversion apparatus according to the seventh embodiment of the present invention taken along the cutting position H-H.

FIGS. 13A and 13B are a side view of a power conversion apparatus according to an eighth embodiment of the present invention, and a schematic sectional view of the power conversion apparatus according to the eighth embodiment of the present invention taken along the cutting position I-I.

DESCRIPTION OF EMBODIMENTS

Figure 1:
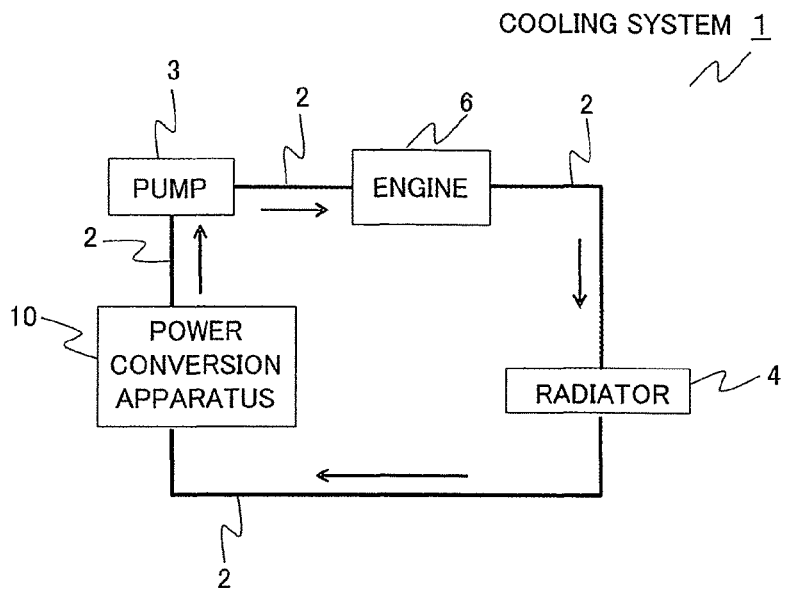
FIG. 1 is a schematic view of a cooling system according to a first embodiment of the present invention.

First Embodiment (FIG. 1 to FIG. 6)

With reference to FIG. 1 to FIG. 6, a cooling system 1, a power conversion apparatus 10, and a cooler 20 according to a first embodiment of the present invention are described. In the drawings, the same or corresponding parts are denoted by the same reference symbols, and the same applies hereinafter.

FIG. 1 is a schematic view of the cooling system 1 according to the first embodiment of the present invention. As illustrated in FIG. 1, the cooling system 1 according to the first embodiment of the present invention includes the power conversion apparatus 10, a pump 3, an engine 6, and a radiator 4. The cooling system 1 is, for example, a cooling system 1 which is configured to cool liquid refrigerant as refrigerant by circulating the liquid refrigerant. The Cooling system 1 is mounted to a vehicle such as an automobile or a train. In the cooling system 1, the pump 3 is connected to the power conversion apparatus 10 and the engine 6, and the radiator 4 is connected to the engine 6 and the power conversion apparatus 10 by refrigerant pipes 2 in which the refrigerant, flows, to thereby form a circulation path. As illustrated, in FIG. 1, in the first embodiment of the present invention, the pump 3, the engine 6, the radiator 4, and the power conversion apparatus 10 are arranged in a clockwise direction.

The pump 3 is a drive source configured to circulate the liquid refrigerant in the refrigerant pipes 2. The refrigerant which is circulated by the pump 3 receives heat in the power conversion apparatus 10 and releases heat in the radiator 4 to the outside. The cooling system 1 may include a reservoir tank configured to store surplus liquid of the refrigerant. Further, the reservoir tank is exposed to atmospheric pressure, and gas, for example, air dissolved in the refrigerant can be removed. The reservoir tank may be provided, for example, between the radiator 4 and the power conversion apparatus 10.

Figure 2:
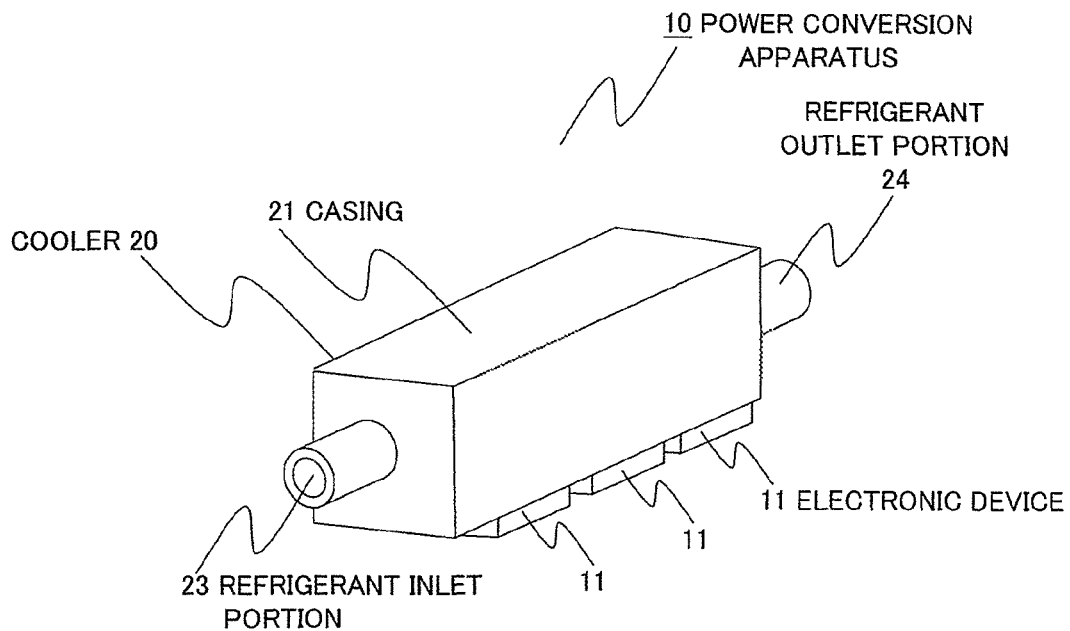
FIG. 2 is an outer appearance perspective view of a power conversion apparatus according to the first embodiment of the present invention.

FIG. 2 is an outer appearance perspective view of the power conversion apparatus 10 according to the first embodiment of the present invention. The power conversion apparatus 10 according to the first embodiment of the present invention includes electronic devices 11 and the cooler 20. In the cooler 20, the electronic devices 11 which generate heat are provided on an outer side of a casing 21. The cooler 20 is configured to remove heat from the electronic devices 11. The electronic devices 11 are provided on at least one of a bottom surface or a side surface of the outer side of the casing 21. In the power conversion apparatus 10 according to the first embodiment of the present invention, the electronic devices 11 are provided on the bottom surface. When the power conversion apparatus 10 including, the casing 21 is installed in the vehicle or the like, a surface of the casing 21 on an upper side in a vertical direction is defined as an upper surface, a surface of the casing 21 on a lower side in the vertical direction is defined as the bottom surface, and surfaces of the casing 21 in a horizontal direction are defined as side surfaces.

Further, in the casing 21 of the cooler 20, a refrigerant flow path is formed. The refrigerant flows into the refrigerant flow path through a refrigerant inlet portion 23, and flows out therefrom through a refrigerant outlet portion 24. The electronic devices 11 heat the refrigerant in the casing 21, and hence the heat is removed from the electronic devices 11. As the electronic device 11 which generates heat, there may be given a control circuit, a drive circuit, a capacitor, a power module such as SiC, or a step-down converter, but the electronic device 11 is not limited thereto. Further, the electronic devices 11 are connected to each other with, for example, harnesses.

Figure 3B:
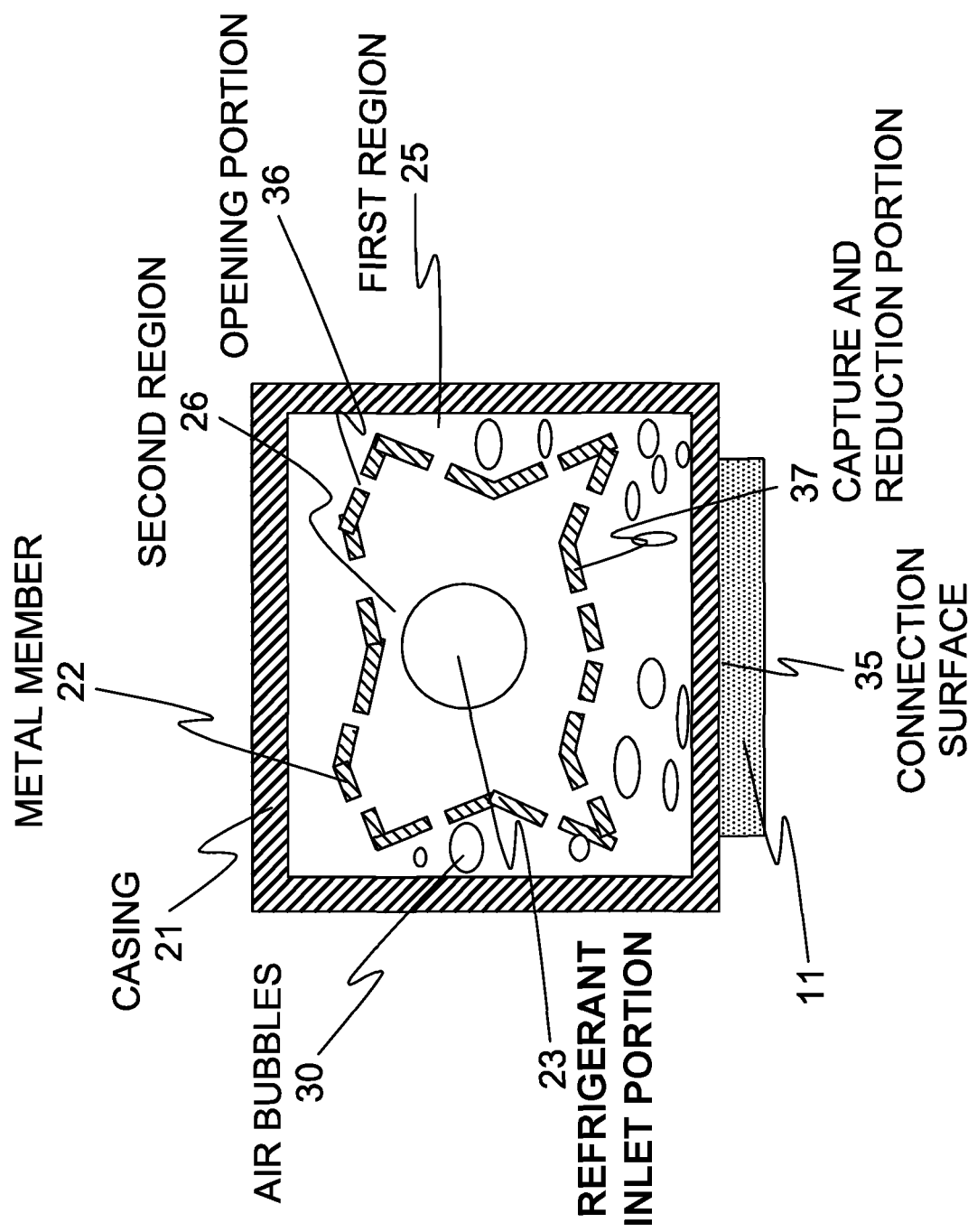
FIG. 3B is a schematic sectional view of the power conversion apparatus according to the first embodiment of the present invention taken along the cutting position A-A of FIG. 3A.
Figure 4:
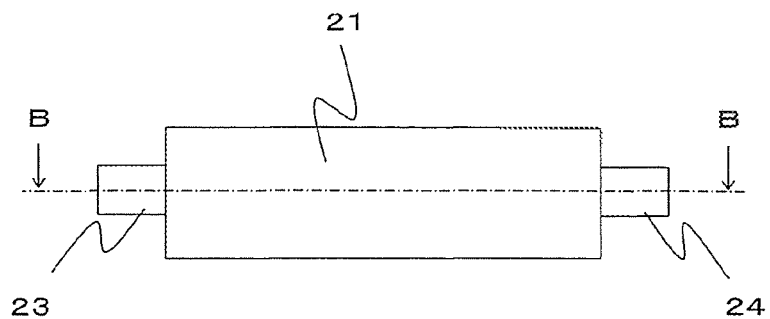
FIG. 4 is a top view of a casing of a cooler provided in the power conversion apparatus according to the first embodiment of the present invention.
Figure 5:
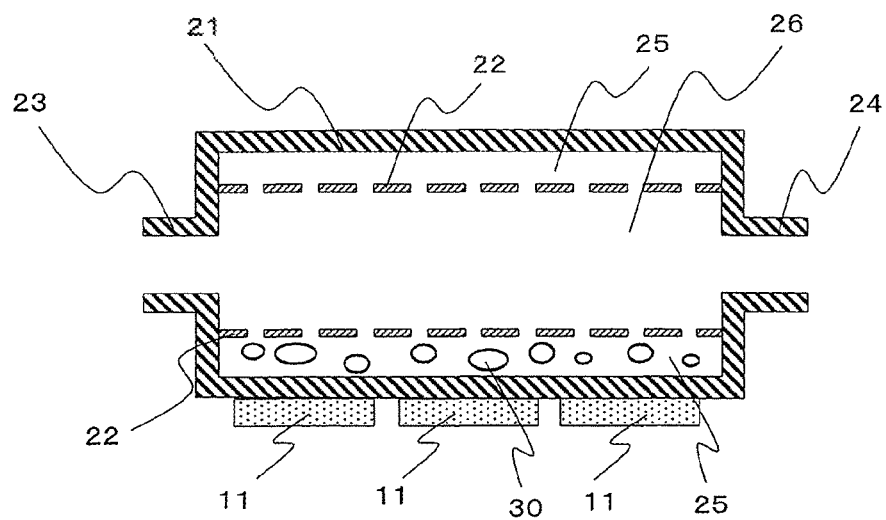
FIG. 5 is a schematic sectional view of the power conversion apparatus according to the first embodiment of the present invention taken along the cutting position B-B.

Next, a configuration of the cooler 20 is described. FIG. 3A is a side view of the power conversion apparatus 10 according to the first embodiment of the present invention, and FIG. 3B and FIG. 3C are a schematic view and a schematic sectional view taken alone the cutting position A-A. In FIG. 3A, the cutting position A-A of the power conversion apparatus 10 in side view is illustrated. FIG. 3B and FIG. 3C are schematic sectional views of two examples of the power conversion apparatus 10 taken along the cutting position A-A. In both of FIG. 3B and FIG. 3C, a cross section of a metal member 22 has a folded shape (zig-zag shape) in a surface opposed to a connection surface 35 which, thermally connects the refrigerant and the electronic devices 11. Further, FIG. 4 is a top view of the power conversion apparatus 10 according to the first embodiment of the present invention. In FIG. 4, the cutting position B-B of the power conversion apparatus 10 in a top view is illustrated. FIG. 5 is a schematic sectional view of the power conversion apparatus 10 according to the first embodiment of the present invention taken along the cutting position B-B.

That is, as illustrated in FIG. 3B, the cooler 20 includes the casing 21 and the metal member 22. The electronic device 11 is cooled by causing the refrigerant to flow in the casing 21. The cooler 20 includes the refrigerant inlet portion 23 which is configured to introduce the refrigerant from an outside of the casing 21 to an inside of the casing 21, the refrigerant outlet portion 24 which is configured to guide the refrigerant from the inside of the casing 21 to the outside of the casing 21, and the metal member 22 which defines a flow path region in which the refrigerant is caused to flow from the refrigerant inlet portion 23 to the refrigerant out et portion 24 in the inside of the casing 21. The metal member 22 includes a plurality of opening portions 36 which cause the refrigerant to pass therethrough, and a capture and reduction portion 37. The capture and reduction portion 37 has such a shape as to capture the air bubbles, which are generated through the connection surface 35 between the casing 21 and the electronic devices 11, so as to reduce the air bubbles through cooling by the refrigerant when the electronic devices 11 are cooled. The capture and reduction portion 37 may have any shape other than a folded shape (zig-zag shape) described above as long as the shape allows the air bubbles to be captured and reduced, such as a wave shape.

The casing 21 in the first embodiment of the present invention is formed of a quadrangular prism. The metal member 22 entirely has an annular a polygonal shape, and partitions the refrigerant flow path into a first region 25 on an outer side, which includes a heated surface of the casing 21 on which the electronic devices 11 are provided, and a second region 26 on an inner side, which includes the refrigerant inlet portion 23 and the refrigerant outlet portion 24. When a straight line connecting the refrigerant inlet portion 23 and the refrigerant outlet portion 24 is defined as an axial direction, the metal member 22 is provided in the refrigerant flow path so as to extend in the axial direction. Further, the metal member 22 partitions the refrigerant flow path, and prevents the air bubbles generated in the vicinity of the heated surface in the first region from moving to the second region. Further, the metal member 22 has a partially folded shape instead of a flat shape, thereby preventing the air bubbles generated in the vicinity of the heated surface in the first region 25 from concentrating in one portion. As a result, an effect of preventing the air bubbles from moving to the second region 26 is enhanced.

Figure 3D:
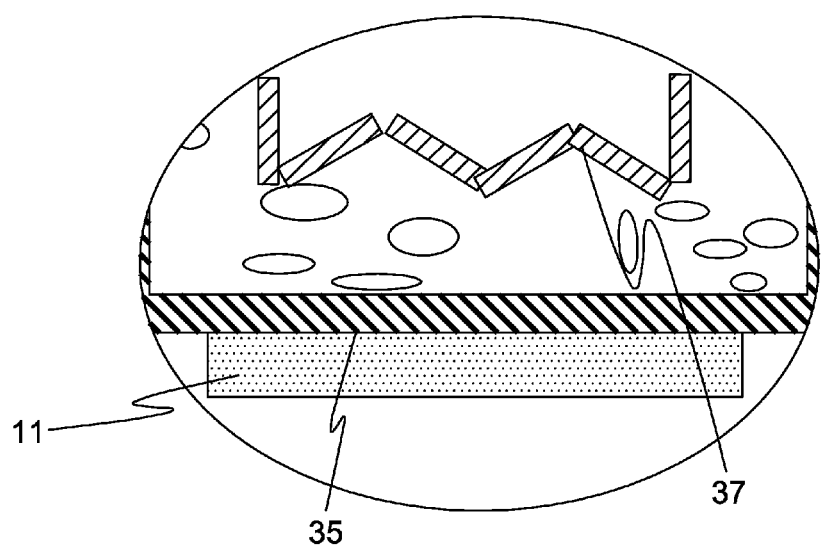
FIG. 3D is a drawing illustrating a portion of the power conversion apparatus according to FIG. 3C having a thinner portion.

Further, as illustrated in FIG. 3D, in the metal member 22 in the first embodiment of the present invention, a thickness of a surface (lower surface) having the capture and reduction portion 37 is set smaller than a thickness of surfaces (side surfaces and upper surface) having no capture and reduction portion 37. Thus, the function of capturing and reducing the air bubbles at the capture and reduction portion 37 can be enhanced. In addition, the metal member 22 can be reduced in weight, thereby being capable of achieving reduction in weight and cost of the power conversion apparatus 10.

In the first embodiment of the present invention, the second region 26 includes the refrigerant inlet portion 23 and the refrigerant outlet, portion 24. Further, the heated surface is a wall surface of the casing 21 of the cooler 20, which corresponds to a part on which the electronic devices 11 are provided. In the first region 25, the electronic devices 11, which generate heat, heat the refrigerant in the casing 21, and the refrigerant is boiled through the heated surface on which the electronic devices 11 are provided. The air bubbles 30 are generated mainly by this process. However, the heat of the electronic devices 11 spreads in the casing 21 through heat conduction, and hence the refrigerant is not necessarily boiled only through the heated surface.

In the first embodiment of the present invention, the refrigerant inlet portion 23 is included in the second region 26. Thus, refrigerant, which releases heat in the radiator 4 to have a lower temperature than a saturation temperature, and flows in through the refrigerant inlet portion 23, can be prevented from flowing to the bottom of the casing 21 of the cooler 20. As a result, the bottom of the casing 21 is prevented from being cooled by the low-temperature refrigerant, and hence generation of the air bubbles 30 from the bottom of the casing 21 of the cooler 20 through the boiling can be promoted.

In the first embodiment of the present invention, the refrigerant inlet portion 23 and the refrigerant outlet portion 24 are termed in the side surfaces of the casing 21, but are not limited to be formed in the casing 21. Further, the cooler 20 is a thin metal plate made of a metal such as aluminum, aluminum alloy, or stainless steel.

The cross section of the cooler 20 necessarily need not have a rectangular shape as illustrated in FIG. 3B, and may have a circular shape, a triangular shape, or other polygonal shapes. As illustrated in FIG. 3B, when the cooler 20 has a rectangular shape in which an aspect ratio of the cross-sectional shape is 1 or approximately 1, the cooler 20 can easily be installed in the vehicle or the like. It is preferred that the aspect ratio be 0.9 to 1.1, and it, is more preferred that the aspect ratio be 1. It is possible to obtain an effect of facilitating the mounting of the cooler 20 to, in particular, a small space such as an engine room.

Further, as the refrigerant, refrigerants such as water, long life coolant (LLC) for the vehicle, and Fluorinert may be employed.

Figure 6:
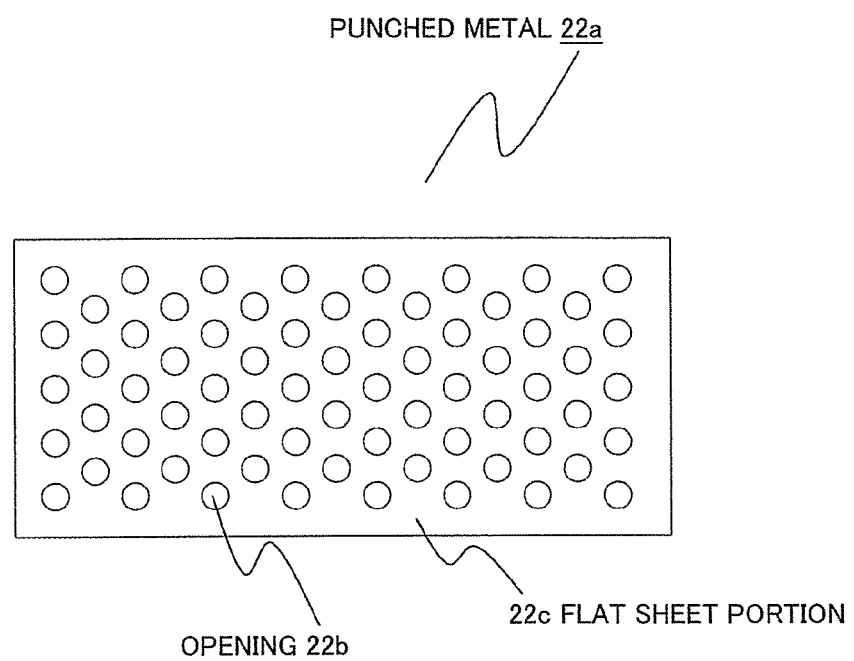
FIG. 6 is a top view of a punched metal serving as a metal member which is used in the cooler according to the first embodiment of the present invention.

FIG. 6 is a top view of a punched metal 22a according to the first embodiment of the present invention. In the first embodiment of the present invention, the punched metal 22a is used as the metal member 22. The punched metal 22a or other metals are mainly used as the metal member 22. The punched metal 22a exemplified as the metal member 22 has a plurality of openings 22b in a flat sheet portion 22c. With this configuration, the refrigerant passes through the openings 22b, and hence the refrigerant can pass between the first region 25 and the second region 26. Meanwhile, the air bubbles 30 generated through the boiling of the refrigerant can be prevented from moving from the first region 25 to the second region 26 by providing the metal member 22. This is because, as a consequence of a capillary phenomenon which occurs in the openings 22b of the metal member 22, the air bubbles 30 can be prevented from moving from the first region 25 to the second region 26. Further, a plurality of metal members 22 may be provided. Further, in the example where the metal member 22 has a folded shape, the effect of preventing the air bubbles 30 from moving from the first region 25 to the second region 26 is enhanced as compared to a case of the example where the metal member 22 has a flat shape.

An opening diameter of the opening 22b may be set smaller than a diameter of the air bubble 30 which is generated through the boiling at the time of separating from the wall surface of the casing 21. In order to estimate the diameter of the air bubble 30 which is generated through the boiling at the time of separating from the wall surface of the casing 21, the expression of Fritz below can be used. That is, in the metal member 22, the opening diameter of the opening 22b may be smaller than the diameter of the air bubble 30 which is calculated by the expression below. In this case, d represents the diameter [m] of the air bubble 30, $\Phi$ represents a contact angle [rad] when the air bubble 30 separates from the wall surface, $\sigma$ represents a surface tension [N/m] of the refrigerant, g represents a gravitational acceleration [m/s2], $\rho l$ represents a density [kg/m3] of the liquid refrigerant, and $\rho v$ represents a density [kg/m3] of a saturated steam of the refrigerant. For reference, when the diameter of the air bubble 30 is estimated using the expression of Fritz, in a situation where water is used as refrigerant, the diameter of the air bubble 30 which is generated through the boiling at the time of separating from the wall surface of the casing 21 is from about 2 mm to about 3 mm. In a situation where LLC is used as refrigerant, the diameter of the air bubble 30 which is generated through the boiling at the time of separating from the wall surface of the casing 21 is about 1 mm.

$$d=0.0209\Phi\sqrt{(\sigma/(g(\rho l-\rho v)))}$$ Expression of Fritz:

When the opening 22b has a circular shape, it is preferred that the opening diameter of the opening 22b be from 0.1 mm to 3.0 mm, and it is more preferred that the opening diameter of the opening 22b be from 0.5 mm to 2.5 mm. When the opening diameter exceeds 3.0 mm, there is a situation in which the air bubbles 30 are liable to pass through the opening 22b. Further, when the opening diameter is less than 0.1 mm, it is difficult for the liquid refrigerant to pass between the first region 25 and the second region 26. Thus, there may be a situation in which an internal temperature of the first region 25 continues to rise and the cooling efficiency decreases. That is, the opening diameter is determined by the balance between prevention of the passage of air bubbles and the cooling efficiency. However, the opening diameter of the opening 22b is not limited to from 0.1 mm to 3.0 mm. In the metal member 22, the size of the opening diameter or the opening ratio of the opening 22b can be suitably adjusted. In this case, the opening 22b may have not only a circular shape, but also various shapes such as an elliptical shape, a square shape, a triangular shape, or a rectangular shape. Except for a case in which the opening 22b has a circular shape, an equivalent diameter may be regarded as the opening diameter. Further, a porous body may be used as the metal member 22. When the porous body is used, an average of the pore diameters of the porous body may be regarded as the opening diameter. In addition, the opening 22b only needs to have an opening width smaller than the diameter of the air bubble 30. For example, the opening 22b may be a slit with one opening 22b having an opening width smaller than the diameter of the air bubble 30 and the other opening 22b having a large opening width.

In order to facilitate the mounting of the metal member 22 to the casing 21, a frame for mounting the metal member 22 may be provided to the casing 21. With this configuration, in accordance with change in specification such as change of the type of refrigerant, change of a heat generating amount of the electronic device 11 through change of the type of electronic device 11, or change of an outside temperature, the metal member 22 can be easily switched, and the opening diameter of the opening 22b can be changed. The metal member 22 is fixed to the wall surface of the casing 21, for example, with a screw or by welding. In the first embodiment of the present invention, the punched metal 22a is fixed to the wall surface of the casing 21 by welding. It is preferred that the material of the metal member 22 be the same as the material of the casing 21 of the cooler 20. In this manner, corrosion can be prevented.

OPERATION

Next, the operation of the cooling, system 1, the power conversion apparatus 10, and the cooler 20 according to the first embodiment of the present invention is described. As indicated by the arrows of FIG. 1, the refrigerant is delivered by the pump 3 in a direction toward the engine 6. The refrigerant flows through the engine 6, the radiator 4, the power conversion apparatus 10, and the pump 3 in the stated order. In this manner, the refrigerant circulates through the cooling system 1. In this process, the refrigerant receives heat in the power conversion apparatus 10 and releases the heat in the radiator 4.

The refrigerant inlet portion 23 illustrated in FIG. 2 is connected to the radiator 4 side, and the refrigerant outlet portion side 24 side is connected to the pump 3 side. In this manner, the refrigerant flows from the refrigerant inlet portion 23 to the refrigerant outlet portion 24 side. In the power conversion apparatus 10 in which the electronic devices 11 which generate heat are provided on the bottom surface of the cooler 20, the refrigerant in the cooler 20 is heated to be boiled by the heat of the electronic devices 11 through the heated surface of the bottom surface of the cooler 20 as illustrated in FIG. 3B, thereby generating the air bubbles 30.

In this situation, the boiling occurs when a temperature of the wall surface inside the casing 21 is equal to or more than the saturation temperature of the refrigerant. When the air bubbles 30 separate from the wall surface inside the casing 21, the surrounding refrigerant flows to a portion from which the air bubbles 30 separate so that a heat transfer coefficient is enhanced by the convection of the refrigerant. In addition, the air bubbles generated through the boiling draw heat from the surrounding refrigerant by an amount corresponding to latent heat required for phase transition of the refrigerant, thereby cooling the surrounding refrigerant. When the water is taken as an example, heat of 420 kJ is required in a situation where 1 liter of water is heated from 0° C. to the saturation temperature of 100° C. under 1 atmospheric pressure. Further, when the 1 liter of water is entirely vaporized under 1 atmospheric pressure and at 100° C., 2,256 kJ (latent heat) is required. In this manner, the boiling has a higher cooling performance than liquid cooling, and hence the heat amount transferred from the wall surface of the casing 21 to the refrigerant is increased. As a result, the electronic devices are cooled.

The generated air bubbles 30 rise in the cooler 20 by buoyant force. The air bubbles 30 rise it the cooler 20. However, the punched metal 22a is provided as the metal member 22 in the first embodiment, and the refrigerant flow path is partitioned by the metal member 22 into the first region 25 including the heated surface which is a surface at which the air bubbles 30 are mainly generated, and the second region 26 including the refrigerant inlet portion 23 and the refrigerant outlet portion 24. Thus, the capillary phenomenon occurs in the opening 22b of the punched metal 22a serving as the metal member 22 so that the air bubbles 30 can be prevented from reaching the pump 3 by passing through the opening 22b and the refrigerant outlet portion 24. Further, the air bubbles 30 can be prevented from concentrating in one portion by forming the metal member 22 into a folded shape instead of a flat shape. Accordingly, the contact area with the second region 26 can be increased, and the condensation of the air bubbles 30 can be promoted so that the effect of preventing the air bubbles 30 from flowing out to the second region 26 can be enhanced. Further, for example, even when a small amount of the air bubbles 30 pass through the openings 22b of the punched metal 22a, the small amount of the air bubbles 30 exchange heat with the refrigerant, which releases heat in the radiator 4 to have a lower temperature than the saturation temperature, and flows in through the refrigerant inlet portion 23, so that most of the small amount of air bubbles 30 are instantly condensed to return to the liquid refrigerant. Thus, the air bubbles 30 are prevented from flowing into the pump 3.

As the refrigerant is increased in pressure in the pump 3 and sequentially flows through the engine 6, the radiator 4, and the power conversion apparatus 10, the pressure of the refrigerant becomes smaller due to the pressure loss. In order to generate the air bubbles 30 after the refrigerant in the cooler 20 is heated by the heat of the electronic devices 11 and is boiled through the heated surface at the bottom surface of the cooler 20, the boiling can more easily be caused to occur as the pressure of the refrigerant is smaller. Thus, refrigerant outlet portion 24 is connected to the pump 3 so that the power conversion apparatus 10 is arranged near the pump 3, and the refrigerant flows from the power conversion apparatus 10 to the pump 3. In this manner, the pressure of the refrigerant which flows in the power conversion apparatus 10 can be reduced to be particularly smaller in the cooling system 1, and hence it is possible to facilitate the generation of the air bubbles 30 through the boiling at the bottom surface of the cooler 20. It is preferred that the power conversion apparatus 10 be arranged near the pump 3 as closely as possible, but the positional relationship is not limited thereto. There may be provided any device between the pump 3 and the power conversion apparatus 10.

Ac described above, the cooling system 1 according to the first embodiment of the present invention is a cooling system 1 which is configured to perform cooling by circulating the refrigerant. Further, the cooling system 1 includes the refrigerant pipes 2 in which the refrigerant flows, the pump 3 which is connected to the refrigerant pipes 2 and causes the refrigerant inside the refrigerant pipes 2 to circulate, the radiator 4 which is connected to the refrigerant pipes 2 and is configured to release the heat from the refrigerant which is circulated by the pump to the outside, and the power conversion apparatus 10 which is connected to the refrigerant pipes 2 and is cooled by the refrigerant which is caused to circulate by the pump.

Further, the power conversion apparatus 10 according to the first embodiment of the present invention includes the above-mentioned cooler 20, and the electronic devices 11 which heat the refrigerant in the casing 21 and are provided on any one of the outer bottom surface and the outer side surfaces of the casing 21 of the cooler 20.

In addition, the cooler 20 according to the first embodiment of the present invention includes the casing 21 and the metal member 22. The casing 21 has a hollow prism shape with the refrigerant inlet portion 23 through which the refrigerant flows in and the refrigerant outlet portion 24 through which the refrigerant flows out, and includes the refrigerant flow path through which the refrigerant flows. The metal member 22 is provided inside the casing 21 to partition the refrigerant flow path into the first region 25 and the second region 26. The first region 25 includes the heated surface which heats the refrigerant and corresponds to any one of the bottom surface and the side surfaces of the casing 21. The second region 26 includes the refrigerant inlet portion 23 and the refrigerant outlet portion 24, and has the plurality of openings which prevent the air bubbles 30 generated in the first region 25 from moving to the second region 26.

With this configuration, the refrigerant flow path inside the cooler 20 can be partitioned by the metal member 22 into the first region 25 including the heated surface and the second region 26 including the refrigerant inlet portion 23 and the refrigerant outlet portion 24. Thus, the air bubbles 30 generated through the boiling in the first region 25 are prevented from flowing into the second region 26, thereby being capable of preventing the air bubbles 30 from flowing out of the cooler 20.

Further, the metal member 22 is formed into a folded shape instead of a flat shape, and hence the air bubbles 30 are prevented from concentrating in one portion. As a result, the contact area between the air hubbies 30 and the low-temperature refrigerant present in the second region 26 can be increased. Accordingly, the condensation of the air bubbles 30 is promoted, and the effect of preventing the air bubbles 30 from flowing out of the cooler 20 can be enhanced. In this manner, the air bubbles 30 generated in the cooler 20 through the boiling are prevented from flowing into the pump 3 so that cavitation which occurs when the air bubbles 30 are condensed in the pump 3 can be prevented. Further, the air bubbles 30 generated in the cooler 20 through the boiling are prevented from flowing out of the cooler 20, and hence it is possible to obtain the cooler 20, the power conversion apparatus 10, or the cooling system 1 which can prevent vibration, noise, and breakage of the pipes.

Further, the frame for mounting the metal member 22 is provided to the casing 21, and hence the switching of the metal member 22, the mounting of the plurality of metal members 22 in a laminating manner, or other actions become easier. Therefore, in accordance with the change in specification such as the change of the type of refrigerant, or the change of the heat generating amount of the electronic device 11 through the change of the type of electronic device 11, the opening diameter and the opening ratio of the metal member 22 can easily be adjusted. In this manner, the amount of the refrigerant which passes between the first region 25 and the second region 26 or other factors can appropriately be adjusted, and the cooling efficiency of the electronic device 11 which generates heat can be enhanced.

In the first embodiment of the present invention, the electronic devices 11 which generate heat are cooled through the boiling phenomenon. In general, when the electronic devices 11 are cooled, as a flow rate of the refrigerant flowing in through the refrigerant inlet portion 23 is larger, the heat transfer coefficient becomes larger, thereby being capable of enhancing the cooling efficiency of the electronic devices 11. Meanwhile, in the first embodiment of the present invention, the electronic devices 11 are cooled through the boiling phenomenon, and hence the flow rate of the refrigerant flowing in through the refrigerant inlet portion 23 hardly affects the cooling efficiency of the electronic devices 11. Thus, even when the opening diameter of the refrigerant inlet portion 23 is increased and the flow rate of the refrigerant which flows in is reduced without changing an inflow amount of the refrigerant, the cooling, efficiency of the electronic devices 11 is not affected. In this case, even when a cross section of the refrigerant flow path in the vertical direction is set larger than an inflow cross section of the refrigerant inlet portion 23 in the vertical direction, the cooling efficiency is not affected and the pressure loss in the cooler 20 can be reduced. Thus, high pressure-increasing performance is not required in the pump 3, thereby being capable of reducing output of the pump 3. As a result, the pump 3 can be reduced in size, thereby being capable of achieving reduction in weight, size, and cost of the cooling system 1.

Figure 7A:
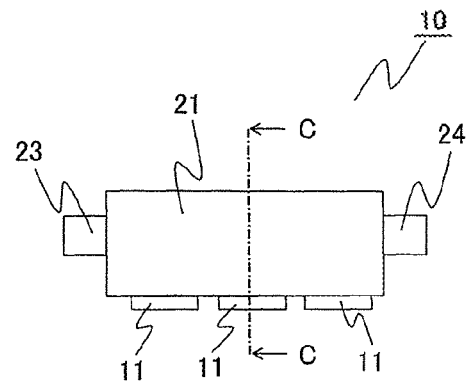
FIGS. 7A to 7C are a side view of a power conversion apparatus according to a second embodiment of the present invention, and a schematic sectional view and an enlarged view of the power conversion apparatus according to the second embodiment of the present invention taken along the cutting position C-C.
Figure 7B:
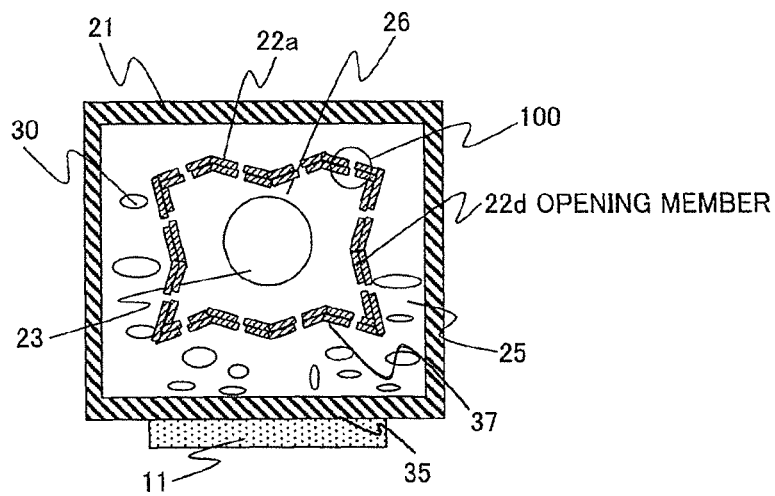
Figure 7C:
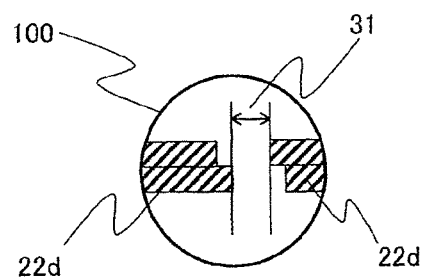

Second Embodiment (FIGS. 7A to 7C)

With reference to FIGS. 7A to 7C, the cooling system 1, the power conversion apparatus 10, and the cooler 20 according to a second embodiment of the present invention are described. In the cooling system 1, the power conversion apparatus 10, and the cooler 20 according to the first embodiment, an example where one metal member 22 is mounted is described. In the second embodiment of the present invention, there is described an example in which the plurality of metal members 22 are mounted. Now, matters which differ from those of the first embodiment are mainly described, and description of the same or corresponding parts is omitted.

FIGS. 7A to 7C are a side view of the power conversion apparatus 10 according to the second embodiment of the present invention, and a schematic sectional view and an enlarged view of the power conversion apparatus 10 according to the second embodiment of the present invention taken along the cutting position C-C. FIG. 7A is a side view of the power conversion apparatus 10, in which the cutting position C-C is illustrated. FIG. 7B is a schematic sectional view taken along the cutting position C-C. FIG. 7C is an illustration of an enlarged portion 100 of the metal member 22. The shape of the metal member 22 illustrated in FIGS. 7A to 7C is similar to that of the metal member 22 described in the first embodiment in that the metal member 22 is provided in the refrigerant flow path so as to extend in the axial direction, and partitions the refrigerant flow path. As illustrated in FIG. 7B, two metal members 22 may be provided in a laminating manner. In this manner, the metal members 22 may be formed by laminating two or more opening members 22d through increase of the number of the metal members 22 to two or three instead of mounting only one opening member 22d. Further, the air bubbles 30 can be prevented from concentrating in one portion by forming the metal, member 22 into a folded shape instead of a flat shape. Accordingly, the contact area with the second region 26 can be increased, and the condensation of the air bubbles 30 can be promoted so that the effect of preventing the air bubbles 30 from flowing out to the second region 26 can be enhanced. When the metal members 22 are formed by laminating two or more opening members 22d, there are obtained not only an effect of dispersing vapor bubbles at the first opening member 22d but also an effect of dispersing the vapor bubbles at the second and subsequent opening members 22d, thereby contributing to the enhancement of the effect of preventing the vapor bubbles from flowing out.

With this configuration, the metal members 22 are formed by laminating two or more opening members 22d, and hence the strength of the metal member 22 is enhanced as compared to the metal member 22 formed by one opening member 22d. Further, through lamination of two or more opening members 22d, the air bubbles 30 are prevented from concentrating in one portion of the metal member 22 and the air bubbles 30 that gather are dispersed. In this manner, the contact area between the second region 26 and the air bubbles 30 is increased, and the effect of preventing the air bubbles 30 from flowing out of the cooler 20 can be enhanced.

Third Embodiment (FIGS. 8A and (B)

With reference to FIGS. 8A and 8B, the cooling system 1, the power conversion apparatus 10, and the cooler 20 according to a third embodiment of the present invention are described. In the cooling system 1, the power conversion apparatus 10, and the cooler 20 according to the first embodiment, the metal member 22 having a polygonal cross-sectional shape is described. In the third embodiment of the present invention, a modification example of the shape of the metal member 22 is described. Now, matters which differ from those of the first embodiment are mainly described, and description of the same or corresponding parts is omitted.

FIGS. 8A and 8B are a side view of the power conversion apparatus 10 according to the third embodiment of the present invention, and a schematic sectional view of the power conversion apparatus 10 according to the third embodiment of the present invention taken along the cutting position D-D. FIG. 8A is a side view of the power conversion apparatus 10, in which the cutting position D-D is illustrated. FIG. 8B is a schematic sectional view taken along the cutting position D-D. The modification example of the shape of the metal member 22 illustrated in FIGS. 8A and 8B is similar to that of the metal member 22 described in the first embodiment in that the metal member 22 is provided in the refrigerant flow path so as to extend in the axial direction, and partitions the refrigerant flow path in an up-and-down direction. As illustrated in FIG. 8B, the first region 25 and the second region 26 are formed in such a manner that the metal member 22 is formed to have a shape that is substantially straight and partially folded in cross section in the vertical direction so as to surround an inner side of the casing portion, which corresponds to the connection surface 35. In this manner, the air bubbles 30 are prevented from concentrating in one portion of the metal member 22, and hence the air bubbles 30 that gather can be dispersed. Thus, the contact area between the second region 26 and the air bubbles 30 can be increased, and the effect of preventing the air bubbles 30 from flowing out of the cooler 20 can be enhanced. Further, both ends of the metal member 22 are fixed to the side surfaces of the casing 21 of the cooler 20.

With this configuration, the air bubbles 30, which are generated by causing the refrigerant to be boiled by receiving heat from the electronic devices 11 which generate heat and are provided on the lower portion of the casing 21, are prevented from flowing from the first region 25 to the second region 26 by the metal member 22. Further, the metal member 22 is formed into a folded shape instead of a flat shape, and hence the air bubbles 30 are prevented from concentrating in one portion of the metal member 22. At the same time, the air bubbles 30 that gather can be dispersed and the contact area between the second region 26 and the air bubbles 30 can be increased, thereby being capable of enhancing the effect of preventing the air bubbles 30 from flowing out of the cooler 20. Further, the metal member 22 can be reduced in weight as compared to the metal member 22 having a polygonal cross section, thereby being capable of achieving reduction in weight and cost of the power conversion apparatus 10.

Fourth Embodiment (FIGS. 9A and 9B)

With reference to FIGS. 9A and 9B, the cooling system 1, the power conversion apparatus 10, and the cooler 20 according to a fourth embodiment of the present invention are described. In the cooling system 1, the power conversion apparatus 10, and the cooler 20 according to the first embodiment, the metal member 22 having a polygonal cross-sectional shape is described. In the fourth embodiment of the present invention, a modification example of the shape of the metal member 22 is described. Now, matters which differ from those of the first embodiment are mainly described, and description of the same or corresponding parts is omitted.

FIGS. 9A and 9B are a side view of the power conversion apparatus 10 according to the fourth embodiment of the present invention, and a schematic sectional view of the power conversion apparatus 10 according to the fourth embodiment of the present invention taken along the cutting position E-E. FIG. 9A is a side view of the power conversion apparatus 10, in which the cutting position E-E is illustrated. FIG. 9B is a schematic sectional view taken along the cutting position E-E. The shape of the metal member 22 illustrated in FIGS. 9A and 9B is similar to that of the metal member 22 described in the first embodiment in that the metal member 22 is provided in the refrigerant flow path so as to extend in the axial direction, and partitions the refrigerant flow path. As illustrated in FIG. 9B, the cross section of the metal member 22 draws a downward recessed arc on the whole and partially has a folded shape. The ends of the metal member 22 are fixed to the side surfaces of the casing 21 of the cooler 20, and the metal member 22 is not in contact with the bottom surface of the casing 21 of the cooler 20.

With this configuration, the air bubbles 30, which are generated by causing the refrigerant to be boiled by receiving heat from the electronic devices 11 which generate heat and are provided on the lower portion of the casing 21, are prevented from flowing from the first region 25 to the second region 26 by the metal member 22. Further, the metal member 22 is formed into a folded shape instead of a flat shape. Thus, the air bubbles 30 are prevented from concentrating in one portion of the metal member 22 and the air bubbles 30 that gather can be dispersed. As a result, the contact area between the second region 26 and the air bubbles 30 can be increased, thereby being capable of enhancing the effect of preventing the air bubbles 30 from flowing out of the cooler 20. Further, the metal member 22 can be reduced in weight as compared to the metal member 22 having an annular cross section, thereby being capable of achieving reduction in weight and cost of the power conversion apparatus 10.

Fifth Embodiment (FIGS. 10A and 10B)

With reference to FIGS. 10A and 10B, the cooling system 1, the power conversion apparatus 10, and the cooler 20 according to a fifth embodiment of the present invention are described. In the cooling system 1, the power conversion apparatus 10, and the cooler 20 according to the first embodiment, the metal member 22 having a polygonal cross-sectional shape is described. In the fifth embodiment of the present invention, a modification example of the shape of the metal member 22 is described. Now, matters which differ from those of the first embodiment are mainly described, and description of the same or corresponding parts is omitted.

FIGS. 10A and 10B are a side view of the power conversion apparatus 10 according to the fifth embodiment of the present invention, and a schematic sectional view of the power conversion apparatus 10 according to the fifth embodiment of the present invention taken along the cutting position F-F. FIG. 10A is a side view of the power conversion apparatus 10, in which the cutting position F-F is illustrated. FIG. 10B is a schematic sectional view taken along the cutting position F-F. The modification example of the shape of the metal member 22 illustrated in FIGS. 10A and 10B is similar to that of the metal member 22 described in the first embodiment in that the metal member 22 is provided in the refrigerant flow path so as to extend in the axial direction, and partitions the refrigerant flow path. As illustrated in FIG. 10B, the metal member 22 has a cross section having substantially an upward protruding triangular shape and partially a folded shape. The ends of the metal member 22 are fixed to two lower corners among four corners of the casing 21 of the cooler 20.

With this configuration, the air bubbles 30, which are generated by causing the refrigerant to be boiled by receiving heat from the electronic devices 11 which generate heat and are provided on the lower portion of the casing 21, are prevented from flowing from the first region 25 to the second region 26 by the metal member 22. Further, the metal member 22 is formed into a folded shape instead of a flat shape, and hence the air bubbles 30 are prevented from concentrating in one portion of the metal member 22. At the same time, the air bubbles 30 that gather can be dispersed and the contact area between the second region 26 and the air bubbles 30 can be increased, thereby being capable of enhancing the effect of preventing the air bubbles 30 from flowing out of the cooler 20. Further, the metal member 22 can be reduced in weight as compared to the metal member 22 having a polygonal cross section, thereby being capable of achieving reduction in weight and cost of the power conversion apparatus 10.

Sixth Embodiment (FIGS. 11A and 11B)

With reference to FIGS. 11A and 11B, the cooling system 1, the power conversion apparatus 10, and the cooler 20 according to a sixth embodiment of the present invention are described. In the cooling system 1, the power conversion apparatus 10, and the cooler 20 according to the first embodiment, the metal member 22 having a polygonal cross-sectional shape is described. In the sixth embodiment of the present invention, a modification example of the shape of the metal member 22 is described. Now, matters which differ from those of the first embodiment are mainly described, and description of the same or corresponding parts is omitted.

FIGS. 11A and 11B are a side view of the power conversion apparatus 10 according to the sixth embodiment of the present invention, and a schematic sectional view of the power conversion apparatus 10 according to the sixth embodiment of the present invention taken along the cutting position G-G. FIG. 11A is a side view of the power conversion apparatus 10, in which the cutting position G-G is illustrated. FIG. 11B is a schematic sectional view taken along the cutting position G-G. The modification example of the shape of the metal member 22 illustrated in FIGS. 11A and 11B is similar to that of the metal member 22 described in the first embodiment in that the metal member 22 is provided in the refrigerant flow path so as to extend in the axial direction, and partitions the refrigerant flow path. As illustrated in FIG. 11B, the metal member 22 has a cross section having substantially a U-shape and partially a folded shape, and is mounted so as to cover the inner side of the casing portion, which corresponds to the heated connection surface 35. The ends of the metal member 22 are fixed to the bottom surface of the casing 21 of the cooler 20.

With this configuration, the air bubbles 30, which are generated by causing the refrigerant to be boiled by receiving heat from the electronic devices 11 which generate heat and are provided on the lower portion of the casing 21, are prevented from flowing from the first region 25 to the second region 26 by the metal member 22. Further, the metal member 22 is formed into a folded shape instead of a flat shape, and hence the air bubbles 30 are prevented from concentrating in one portion of the metal member 22. At the same time, the air bubbles 30 that gather can be dispersed and the contact area between the second region 26 and the air bubbles 30 can be increased, thereby being capable of enhancing the effect of preventing the air bubbles 30 from flowing out of the cooler 20. Further, the metal member 22 can be reduced in weight as compared to the metal member 22 having a polygonal cross section, thereby being capable of achieving reduction in weight and cost of the power conversion apparatus 10.

Seventh Embodiment (FIGS. 12A and 12B)

With reference to FIGS. 12A and 12B, the cooling system 1, the power conversion apparatus 10, and the cooler 20 according to a seventh embodiment of the present invention are described. In the cooling system 1, the power conversion apparatus 10, and the cooler 20 according to the first embodiment, the metal member 22 having an annular cross-sectional shape is described. In the seventh embodiment of the present invention, a modification example of the shape of the metal member 22 is described. Now, matters which differ from those of the first embodiment are mainly described, and description of the same or corresponding parts is omitted.

FIGS. 12A and 12B are a side view of the power conversion apparatus 10 according to the seventh embodiment of the present invention, and a schematic sectional view of the power conversion apparatus 10 according to the seventh embodiment of the present invention taken along the cutting position H-H. FIG. 12A is a side view of the power conversion apparatus 10, in which the cutting position H-H is illustrated. FIG. 12B is a schematic sectional view taken along the cutting position H-H. The modification example of the shape of the metal member 22 illustrated in FIGS. 12A and 12B is similar to that of the metal member 22 described in the first embodiment in that the metal member 22 is provided in the refrigerant flow path so as to extend in the axial direction, and partitions the refrigerant flow path. As illustrated in FIG. 12B, the cross section H-H is a cross section in the vertical direction, and the cross section of the metal member 22 has substantially a V-shape and particularly a folded shape. The ends of the metal member 22 are fixed to upper two corners among four corners of the casing 21 of the cooler 20 and a bottom center portion of the casing 21. In the seventh embodiment, of the present invention, the first region 25 is partitioned into two regions by the metal member 22.

With this configuration, the air bubbles 30, which are generated by causing the refrigerant to be boiled by receiving heat from the electronic devices 11 which generate heat and are provided on the lower portion of the casing 21, are prevented from flowing from the first region 25 to the second region 26 by the metal member 22. Further, the metal member 22 is formed into a folded shape instead of a flat shape, and hence the air bubbles 30 are prevented from concentrating in one portion of the metal member 22. At the same time, the air bubbles 30 that gather can be dispersed and the contact area between the second region 26 and the air bubbles 30 can be increased, thereby being capable of enhancing the effect of preventing the air bubbles 30 from flowing out of the cooler 20. Further, the metal member 22 can be reduced in weight as compared to the metal member 22 having a polygonal cross section, thereby being capable of achieving reduction in weight and cost of the power conversion apparatus 10.

Eighth Embodiment (FIGS. 13A and 13B)

With reference to FIGS. 13A and 13B, the cooling system 1, the power conversion apparatus 10, and the cooler 20 according to an eighth embodiment of the present invention are described. In the cooling system 1, the power conversion apparatus 10, and the cooler 20 according to the first embodiment, the metal member 22 having a polygonal cross-sectional shape is described. In the eighth embodiment of the present invention, a modification example of the shape of the metal member 22 is described. Now, matters which differ from those of the first embodiment are mainly described, and description of the same or corresponding parts is omitted.

FIGS. 13A and 13B are a side view of the power conversion apparatus 10 according to the eighth embodiment of the present invention, and a schematic sectional view of the power conversion apparatus 10 according to the eighth embodiment of the present invention taken along the cutting position I-I. FIG. 3A is a side view of the power conversion apparatus 10, in which the cutting position I-I is illustrated. FIG. 13B is a schematic sectional view taken along the cutting position I-I. The modification example of the shape of the metal member 22 illustrated in FIGS. 13A and 13B is similar to that of the metal member 22 described in the first embodiment in that the metal member 22 is provided in the refrigerant flow path so as to extend in the axial direction, and partitions the refrigerant flow path. As illustrated in FIG. 13B, the cross section I-I is a cross section in the vertical direction, and the cross section of the metal member 22 has substantially a W-shape and partially a folded shape. The ends of the metal member 22 are fixed to upper two corners among four corners of the casing 21 of the cooler 20 and two portions of the bottom of the casing 21. In the eighth embodiment of the present invention, the first region 25 is partitioned into three regions by the metal member 22.

With this configuration, the air bubbles 30, which are generated by causing the refrigerant to be boiled by receiving heat from the electronic devices 11 which generate heat and are provided on the lower portion of the casing 21, are prevented from flowing from the first region 25 to the second region 26 by the metal member 22. Further, the metal member 22 is formed into a folded shape instead of a flat shape, and hence the air bubbles 30 are prevented from concentrating in one portion of the metal member 22. At the same time, the air bubbles 30 that gather can be dispersed and the contact area between the second region 26 and the air bubbles 30 can be increased, thereby being capable of enhancing the effect of preventing the air bubbles 30 from flowing out of the cooler 20. Further, the metal member 22 can be reduced in weight as compared to the metal member 22 having a polygonal cross section, thereby being capable of achieving reduction in weight and cost of the power conversion apparatus 10.

Figure 14:
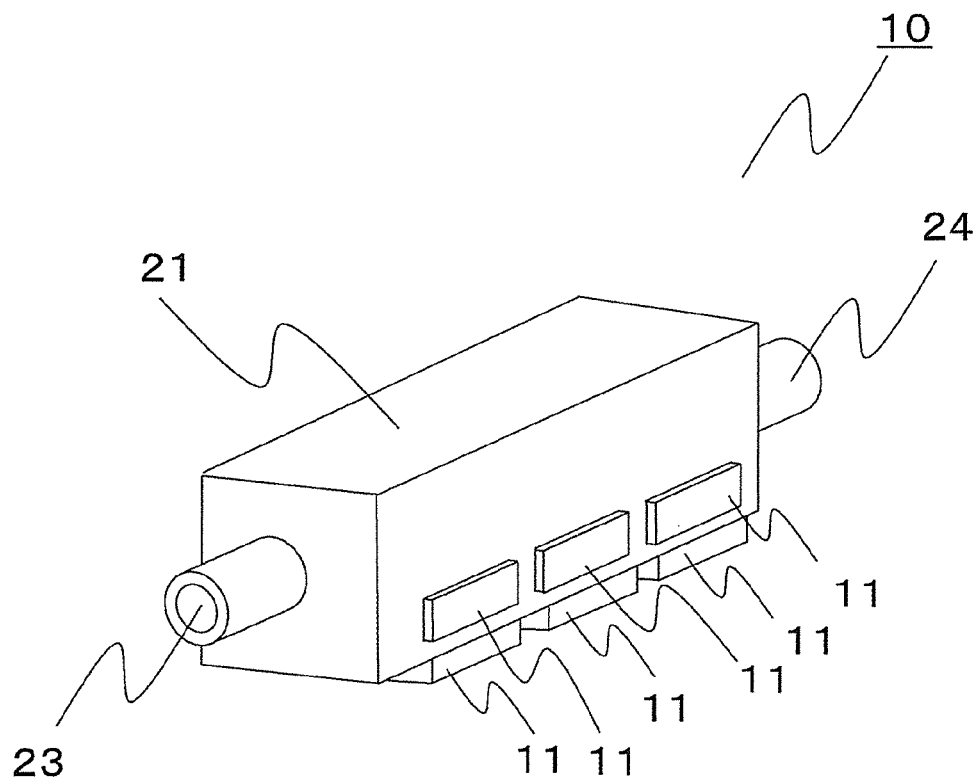
FIG. 14 is an outer appearance perspective view of a power conversion apparatus according to a ninth embodiment of the present invention.
Figures 15A, 15B:
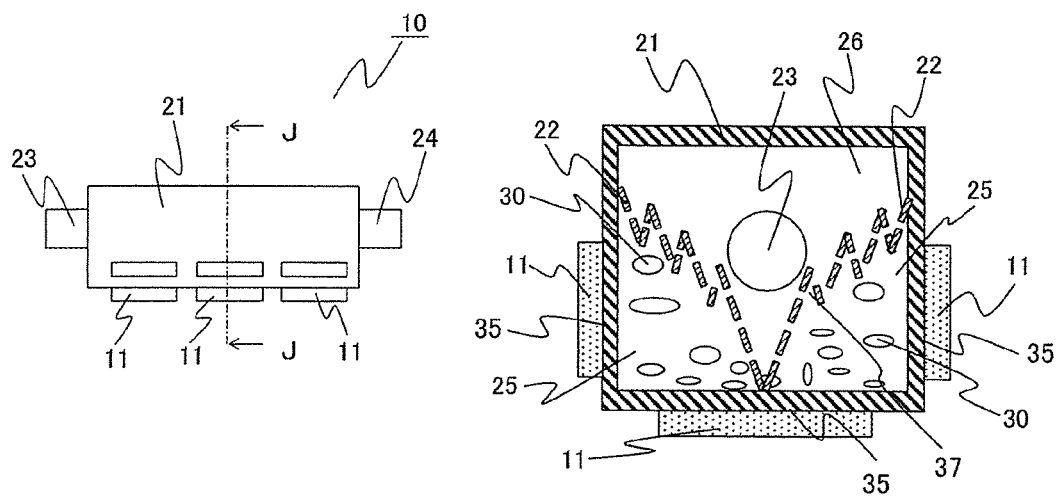
FIGS. 15A and 15B are a side view of the power conversion apparatus according to the ninth embodiment of the present invention, and a schematic sectional view of the power conversion apparatus according to the ninth embodiment of the present invention taken along the cutting position J-J.

Ninth Embodiment (FIG. 14 and FIGS. 15A and 15B)

With reference to FIG. 14 and FIGS. 15A and 15B, the cooling system 1, the power conversion apparatus 10, and the cooler 20 according to a ninth embodiment of the present invention are described. In the cooling system 1, the power conversion apparatus 10, and the cooler 20 according to the first embodiment, the situation in which the electronic devices 11 which generate heat are provided on the outer bottom surface of the casing 21 of the cooler 20 is described. In the ninth embodiment of the present invention, there is described a situation in which the electronic devices 11 which generate heat are provided not only on the outer bottom surface of the casing 21 of the cooler 20 but also on the outer side surface of the casing 21 of the cooler 20. Now, matters which differ from those of the first embodiment are mainly described, and description of the same or corresponding parts is omitted.

FIG. 14 is an outer appearance perspective view of the power conversion apparatus 10 according to the ninth embodiment of the present invention. As illustrated FIG. 14, the power conversion apparatus 10 according to the ninth embodiment the present invention includes the electronic devices 11 and the cooler 20. The electronic devices 11 are provided not only on the outer bottom surface of the casing 21 of the cooler 20 but also on the outer side surface of the casing 21 of the cooler 20. Thus, in the power conversion apparatus 10 according to the ninth embodiment of the present invention, the heated surfaces are provided not only on the bottom surface of the casing 21 of the cooler 20 but also on the side surface of the casing 21 of the cooler 20.

FIGS. 15A and 15B are a side view of the power conversion apparatus 10 according to the ninth embodiment of the present invention, and a schematic sectional view of the power conversion apparatus 10 according to the ninth embodiment of the present invention taken along the cutting position J-J. In FIG. 15A, the cutting position J-J of the power conversion apparatus 10 in side view is illustrated. FIG. 15B is a schematic sectional view of the power conversion apparatus 10 taken along the cutting position J-J.

The cross section of the metal member 22 illustrated in FIG. 15B has a folded (zig-zag) V-shape. The ends of the metal member 22 are fixed to two upper corners among four corners of the casing 21 of the cooler 20, and the ends of the metal member 22 are fixed to a portion near the center of the bottom surface of the casing 21 of the cooler 20. In the ninth embodiment of the present invention, the refrigerant flow path is partitioned into three regions by the metal member 22, and, each region has a triangular cross section. In the power conversion apparatus 10 according to the ninth embodiment of the present invention, the connection surfaces 35 are provided not only on the bottom surface of the casing 21 of the cooler 20 but also on the side surfaces of the casing 21 of the cooler 20. In the refrigerant flow path which is partitioned into three regions, two regions correspond to the first regions 25 each including the heated surface which heats the refrigerant. The one remaining region corresponds to the second region 26 which includes the refrigerant inlet portion 23 and the refrigerant outlet portion 24. That is, the first region 25 is partitioned into the plurality of regions by the metal member 22.

The refrigerant inside the cooler 20 is heated by the electronic devices 11 which are provided on the outer bottom surface of the casing 21 of the cooler 20 and on the outer side surfaces of the casing 21 of the cooler 20, and hence the refrigerant is boiled so that the air bubbles 30 are generated. Then, in the first regions 25, the air bubbles 30 are generated mainly at the inner side portions of the casing 21, which correspond to the connection surfaces 35 which heat the refrigerant, and then separate therefrom. The air bubbles 30 which, have separated rise by the buoyant force, but, the air bubbles 30 can be prevented from passing through the openings 22b to reach the pump 3 through the refrigerant outlet by the metal member 22. The air bubbles 30 generated through the boiling rise by the buoyant force, and hence it is preferred that the electronic devices 11 be provided on the outer side surfaces of the casing 21 of the cooler 20 and be provided at portions as low as possible.

With this configuration, the air bubbles 30, which are generated by causing the refrigerant to be boiled by receiving heat from the electronic devices 11 which generate heat and are provided on the lower portion of the casing 21, are prevented from flowing from the first region 25 to the second region 26 by the metal member 22. Further, the metal member 22 can be reduced in weight as compared to the metal member 22 having a polygonal cross section, thereby being capable of achieving reduction in weight and cost of the power conversion apparatus 10.

Figure 16A:
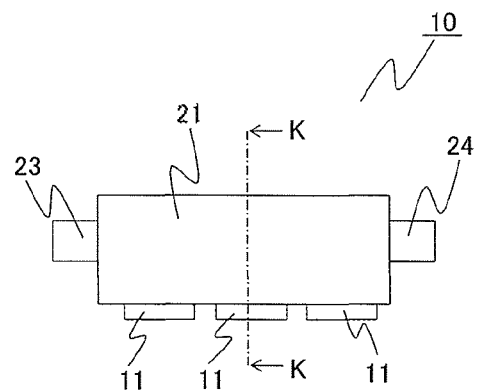
FIGS. 16A to 16C are a side view of a power conversion apparatus according to a tenth embodiment of the present invention, and a schematic sectional view and an enlarged view of the power conversion apparatus according to the tenth embodiment of the present invention taken along the cutting position K-K.
Figures 16B, 16C:
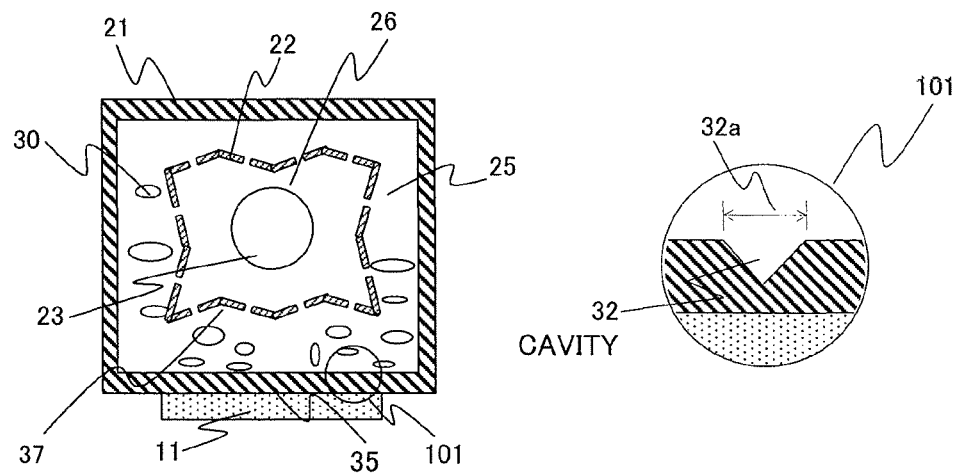

Tenth Embodiment (FIGS. 16A to 16C)

With reference to FIGS. 16A to 16C, the cooling system 1, the power conversion apparatus 10, and the cooler 20 according to a tenth embodiment of the present invention are described. In the embodiment of the present invention, there is described a modification example in which a cavity 32 is formed on the inner side of the casing portion, which corresponds to the connection surface 35 of the cooler 20, in the cooling system 1, the power conversion apparatus 10, and the cooler 20 according to the first embodiment. Now, matters which differ from those of the first embodiment are mainly described, and description of the same or corresponding parts is omitted.

FIGS. 16A to 16C are a side vie the power conversion apparatus 10 according to the tenth embodiment of the present invention, and a schematic sectional view and an enlarged view of the power conversion apparatus 10 according to the tenth embodiment of the present invention taken along the cutting position K-K. In FIG. 16A, the cutting position K-K of the power conversion apparatus 10 in side view is illustrated. FIG. 16B is a schematic sectional view of the power conversion apparatus 10 taken along the cutting position K-K. Further, FIG. 16C is an enlarged view of an enlarged portion 101 of the power conversion apparatus 10.

As illustrated in FIG. 16B, the cross section taken along the cutting position K-K is a cross section in the vertical direction, and the cavity 32 is formed on the inner side of the casing portion, which corresponds to the connection surface 35 on the inner side of the casing 21 on which the electronic devices 11 are provided. The cavity 32 is a minute scratch or a recessed portion formed in a heat transfer surface, and is formed of a groove or a cut and raised portion formed through oxidation treatment, metal baking, thermal spraying, sandblasting treatment, or formation with use of a cutting tool. FIG. 16C is an enlarged view of the cavity. It is preferred that the cavity 32 which is formed in the heated surface on the inner side of the casing 21, have a width 32a of 10 µm to 1,000 µm. The shape of the cavity 32 is not limited to a triangular shape illustrated in FIG. 16C, and only needs to be a shape which can hold the air bubbles.

With this configuration, the air bubbles 30 which are captured by the cavity 32 serve as a core, and the air bubbles 30 which are generated through the boiling are easily generated. In this manner, a frequency of generation of the air bubbles 30 can be increased, and hence the cooling performance of the cooler 20 can be enhanced.

Figure 17A:
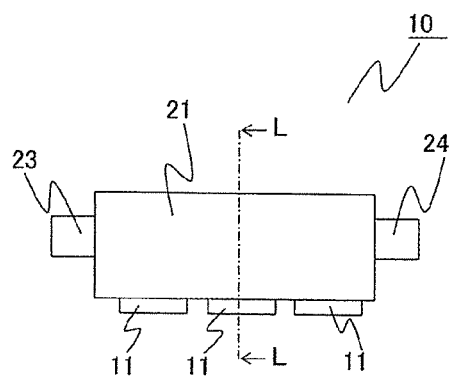
FIGS. 17A to 17C are a side view of a power conversion apparatus according to an eleventh embodiment of the present invention, and a schematic sectional view and an enlarged view of the power conversion apparatus according to the eleventh embodiment of the present invention taken along the cutting position L-L.
Figure 17B:
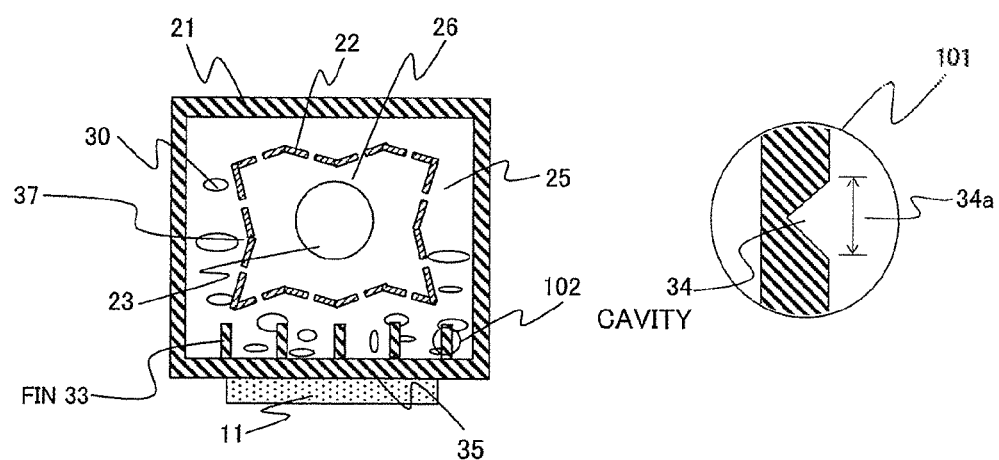
Figure 17C:

Eleventh Embodiment (FIGS. 17A to 17C)

With reference to FIGS. 17A to 17C, the cooling system 1, the power conversion apparatus 10, and the cooler 20 according to an eleventh embodiment of the present invention are described. In the eleventh embodiment of the present invention, there is described a modification example in which fins 33 are provided on the inner side of the casing portion, which corresponds to the connection surface 35 of the cooler 20, in the cooling system 1, the power conversion apparatus 10, and the cooler 20 according to the first embodiment. Now, matters which differ from those of the first embodiment are mainly described, and description of the same or corresponding part is omitted.

FIGS. 17A to 17C are a side view of the power conversion apparatus 10 according to the eleventh embodiment of the present invention and a schematic sectional view and an enlarged view of the power conversion apparatus 10 according to the eleventh embodiment of the present invention taken along the cutting position L-L. In FIG. 17A, the cutting position L-L of the power conversion apparatus 10 in side view is illustrated. FIG. 17B is a schematic sectional view of the power conversion apparatus 10 taken along the cutting position L-L. Further, FIG. 17C is an enlarged view of an enlarged portion 102 of the power conversion apparatus 10. As illustrated in FIG. 17B and FIG. 17C, the cross section taken along the cutting position L-L is a cross section in the vertical direction, and the fins 33 are provided on the heated surface of the casing 21 on which the electronic devices 11 are provided. The fins 33 extend toward the inner side of the cooler 20. Further, a cavity 34 is formed in the surface of the fin 33. The cavity 34 is a minute scratch or a recessed portion formed on a heat transfer surface, and is formed of a groove or a cut and raised portion formed through oxidation treatment, metal baking, thermal spraying, sandblasting treatment, or formation with use of a cutting tool. FIG. 17C is an enlarged view of the cavity. It is preferred that the cavity 34 which is formed in the fin 33 have a width 34a of 10 µm to 1,000 µm. Further, the cavity 34 may be formed in the heated surface on the inner side of the casing 21.

The fins 33 extend toward the inner side of the cooler 20 in a protruding manner, and hence the area which comes in contact with the refrigerant is increased due to the fins 33, thereby being capable of enhancing heat exchange performance. As a shape of the fin 33, a triangle fin, a pin fin, or other fins can be adopted. The fin 33 may be provided by being welded to the inner side of the casing portion, which corresponds to the connection surface 35, as separate parts, or may be provided by being formed through grooving in the heated surface. Further, an array of the fins 33, a height of the fins 33, the number of the fins 33, or other factors can appropriately be changed depending on the specification.

The shape of the cavity 32 is not limited to the triangular shape illustrated in FIG. 17C, and only needs to be a shape which can hold the air bubbles.

With this configuration, the air bubbles 30 which are captured by the cavity 34 serve as a core, and the air bubbles 30 which are generated through the boiling are easily generated. In this manner, the frequency of generation of the air bubbles 30 is increased, and hence the cooling performance of the cooler 20 can be enhanced. Further, through formation of the fins 33, the heat transfer area is increased so that the heat exchange amount with the refrigerant is increased, thereby being capable of further enhancing the cooling performance of the cooler 20.

In the present invention, within the scope of claims, the embodiments can freely be combined, and each of the embodiments can appropriately be modified or omitted.

REFERENCE SIGNS LIST 1 cooling system, 2 refrigerant pipe, 3 pump, 4 radiator, 10 power conversion apparatus, 11 electronic device, 21 casing, 22 metal member, 22a punched metal, 22b opening, 22c flat sheet portion, 23 refrigerant inlet portion, 24 refrigerant outlet portion, 25 first region, 26 second region, 33 fin, 32, 34 cavity, 35 connection surface, 36 opening portion, 37 capture and reduction portion

The invention claimed is:
1. A cooler for cooling an electronic device, comprising:
a casing having an interior configured to receive a flow of refrigerant;
a refrigerant inlet configured to guide the refrigerant from an outside of the casing to the interior of the casing;
a refrigerant outlet configured to guide the refrigerant from the interior of the casing to the outside of the casing; and
a metal member configured to define a liquid refrigerant flow path region in which the refrigerant in liquid form is able to flow from the refrigerant inlet to the refrigerant outlet in the interior of the casing,
wherein the metal member includes:
a plurality of openings configured to allow the refrigerant to pass through the openings; and
a capture portion having a shape configured to capture any air bubbles generated at a portion of the casing corresponding to a connection surface between the casing and the electronic device,
wherein at least a part of the capture portion is disposed between the liquid refrigerant flow path region and the connection surface.
2. The cooler according to claim 1, wherein the capture portion has a folded shape, a zig-zag shape, or a wave shape.
3. The cooler according to claim 1, wherein the opening portions each have an opening diameter of from 0.1 mm to 3.0 mm.
4. The cooler according to claim 1, wherein the capture portion has an opening of from 0.1 mm to 3.0 mm.
5. The cooler according to claim 1, wherein a portion of the metal member in which the capture portion is provided has a thickness smaller than a remaining portion of the metal member.
6. The cooler according to claim 1, wherein the metal member has a cross section in a vertical direction which is formed into a polygonal shape.
7. The cooler according to claim 1, wherein the casing has a cross section in a vertical direction which is formed into a prism shape.

8. The cooler according to claim 1, wherein the metal member has a cross section in a vertical direction which is formed into a recessed arc.

9. The cooler according to claim 1, wherein the metal member has a cross section in a vertical direction which is formed into a triangular shape.

10. The cooler according to claim 1, wherein the metal member has a cross section in a vertical direction which is formed into a V-shape.

11. The cooler according to claim 1, wherein the metal member has a cross section in a vertical direction which is formed into a W-shape.

12. The cooler according to claim 1, wherein the openings of the metal member each have an opening diameter smaller than a diameter d [m] of each of the air bubbles which is calculated by an expression of $d=0.0209\Phi\sqrt{(\sigma/(g(\rho l-\rho v)))}$, where $\Phi$ [rad] represents a contact angle when the air bubbles separate from the portion of the casing which corresponds to the connection surface, $\sigma$ [N/m] represents the surface tension of the refrigerant, g [m$^2$/s] represents gravitational acceleration, $\rho l$ [kg/s$^2$] represents the density of liquid refrigerant, and $\rho v$ [kg/s$^2$] represents the density of a saturated steam of the refrigerant.

13. The cooler according to claim 1, wherein the metal member is formed by laminating two or more opening members having a folded shape.

14. The cooler according to claim 1, wherein the casing comprises a fin on an inner portion of the casing, which corresponds to the connection surface.

15. The cooler according to claim 14, wherein the fin has a cavity.

16. The cooler according to claim 1, wherein the casing has a cavity on an inner portion of the casing, which corresponds to the connection surface.

17. The cooler according to claim 1, wherein the liquid refrigerant flow path region has a cross section in a vertical direction which is larger than an inflow cross section of the refrigerant inlet in the vertical direction.

18. The cooler according to claim 1, wherein the metal member divides the interior of the casing into a first region comprising the liquid refrigerant flow region and a second region adjacent to the connection surface.

19. The cooler according to claim 18, wherein
the casing has a first surface and a second surface,
the metal member extends from the first surface to the second surface,
the refrigerant inlet is connected to the first surface and the refrigerant outlet is connected to the second surface, so that the refrigerant can flow from the first surface to the second surface in the first region, and
the electronic device is provided on an outer side of the casing.

20. The cooler according to claim 1, wherein the capture portion of the metal member is configured to prevent the bubbles from entering the liquid refrigerant flow region.

21. The cooler according to claim 1, wherein the metal member defines a flow path region extending from the inlet to the outlet of the casing.

22. The cooler according to claim 1, wherein the casing and the metal member are configured such that refrigerant flowing through the casing contacts the metal member and the portion corresponding to the connection surface.

23. The cooler according to claim 1, wherein the capture portion has a shape further configured to reduce a size of the air bubbles through cooling by the refrigerant.

24. The cooler according to claim 1, wherein:
the refrigerant inlet opens to the interior of the casing and allows the refrigerant to flow into the interior of the casing from the outside of the casing; and
the refrigerant outlet opens to the interior of the casing and allows the refrigerant to flow from the interior of the casing to the outside of the casing.

25. A power conversion apparatus, comprising:
a cooler for cooling an electronic device, comprising:
   a casing having an interior configured to receive a flow of refrigerant;
   a refrigerant inlet configured to guide the refrigerant from an outside of the casing to the interior of the casing;
   a refrigerant outlet configured to guide the refrigerant from the interior of the casing to the outside of the casing; and
   a metal member configured to define a liquid refrigerant flow path region in which the refrigerant in liquid form is able to flow from the refrigerant inlet to the refrigerant outlet in the interior of the casing,
   wherein the metal member includes:
     a plurality of openings configured to allow the refrigerant to pass through the openings; and
     a capture portion having a shape configured to capture any air bubbles generated at a portion of the casing corresponding to a connection surface between the casing and the electronic device,
   wherein at least a part of the capture portion is disposed between the liquid refrigerant flow path region and the connection surface; and
an electronic device, which is provided on at least one of an outer bottom surface or an outer side surface of the casing of the cooler, and heats the refrigerant in the casing.

26. A cooling system, which is configured to perform cooling by circulating refrigerant, comprising:
a refrigerant pipe, through which the refrigerant flows;
a pump, which is configured to circulate the refrigerant in the refrigerant pipe, and is connected to the refrigerant pipe;
a radiator, which is connected to the refrigerant pipe, and is configured to release heat of the refrigerant which is circulated by the pump to an outside; and
a power conversion apparatus, which is connected to the refrigerant pipe and is cooled by the refrigerant which is circulated by the pump, comprising:
   a cooler for cooling an electronic device, comprising:
     a casing having an interior configured to receive a flow of refrigerant;
     a refrigerant inlet configured to guide the refrigerant from an outside of the casing to the interior of the casing;
     a refrigerant outlet configured to guide the refrigerant from the interior of the casing to the outside of the casing; and
     a metal member configured to define a liquid refrigerant flow path region in which the refrigerant in liquid form is able to flow from the refrigerant inlet to the refrigerant outlet in the interior of the casing,
     wherein the metal member includes:
       a plurality of openings configured to allow the refrigerant to pass through the openings; and
       a capture portion having a shape configured to capture any air bubbles generated at a portion of the casing corresponding to a connection surface between the casing and the electronic device, wherein at least a part of the capture portion is disposed between the liquid refrigerant flow path region and the connection surface; and an electronic device, which is provided on at least one of an outer bottom surface or an outer side surface of the casing of the cooler, and heats the refrigerant in the casing.

* * * * *